(12) United States Patent
Zhang et al.

(10) Patent No.: US 11,192,365 B1
(45) Date of Patent: Dec. 7, 2021

(54) PIEZOELECTRIC PRINTHEAD AND PRINTING SYSTEM

(71) Applicant: Suzhou New RealFast Technology CO., LTD, Suzhou (CN)

(72) Inventors: Xiaofei Zhang, Suzhou (CN); Liqiang Zhu, Suzhou (CN); Yonglin Xie, Suzhou (CN); Jianfei Jiang, Suzhou (CN)

(73) Assignee: SUZHOU RUIFA PRINTING TECHNOLOGY CO., LTD, Suzhou (CN)

( * ) Notice: Subject to any disclaimer, the term of this patent is extended or adjusted under 35 U.S.C. 154(b) by 0 days.

(21) Appl. No.: 16/912,791

(22) Filed: Jun. 26, 2020

(30) Foreign Application Priority Data

May 13, 2020 (CN) .......................... 202010400836.6

(51) Int. Cl.
| | |
|---|---|
| *B41J 2/14* | (2006.01) |
| *B41J 2/045* | (2006.01) |
| *H05K 1/02* | (2006.01) |

(52) U.S. Cl.
CPC .......... *B41J 2/14201* (2013.01); *B41J 2/045* (2013.01); *H05K 1/028* (2013.01); *B41J 2002/14419* (2013.01); *B41J 2002/14491* (2013.01)

(58) Field of Classification Search
CPC ................. B41J 2/14201; B41J 2/045; B41J 2002/14491; B41J 2002/14419; H05K 1/028
See application file for complete search history.

(56) References Cited

U.S. PATENT DOCUMENTS

| | | |
|---|---|---|
| 5,255,016 A | 10/1993 | Usui et al. |
| 5,640,184 A | 6/1997 | Moynihan et al. |
| 6,243,114 B1 | 6/2001 | Yano et al. |
| 2004/0004649 A1* | 1/2004 | Bibl ...................... B41J 2/1642 347/68 |

FOREIGN PATENT DOCUMENTS

CN 107344453 A 11/2017

OTHER PUBLICATIONS

IP.com search (Year: 2021).*

* cited by examiner

*Primary Examiner* — Lisa Solomon
(74) *Attorney, Agent, or Firm* — Gary A. Kneezel

(57) ABSTRACT

A piezoelectric printhead includes a piezoelectric printing device, a manifold, a U-shaped flexible printed wiring element and an interconnection element. The piezoelectric printing device includes a piezoelectric plate and a substrate with at least one row of drop ejectors; an ink inlet port; signal lines leading to corresponding signal input pads; and ground traces leading to at least one ground return pad. The manifold is fluidically connected to the ink inlet port. The U-shaped flexible printed wiring element includes a device connection region and a pair of legs that extend from the device connection region. The pair of legs includes signal connection lines and at least one ground connection line. The interconnection element is disposed between the device connection region of the U-shaped flexible printing wiring element and a contact layer of the piezoelectric printing device that includes the signal input pads and the at least one ground return pad.

19 Claims, 24 Drawing Sheets

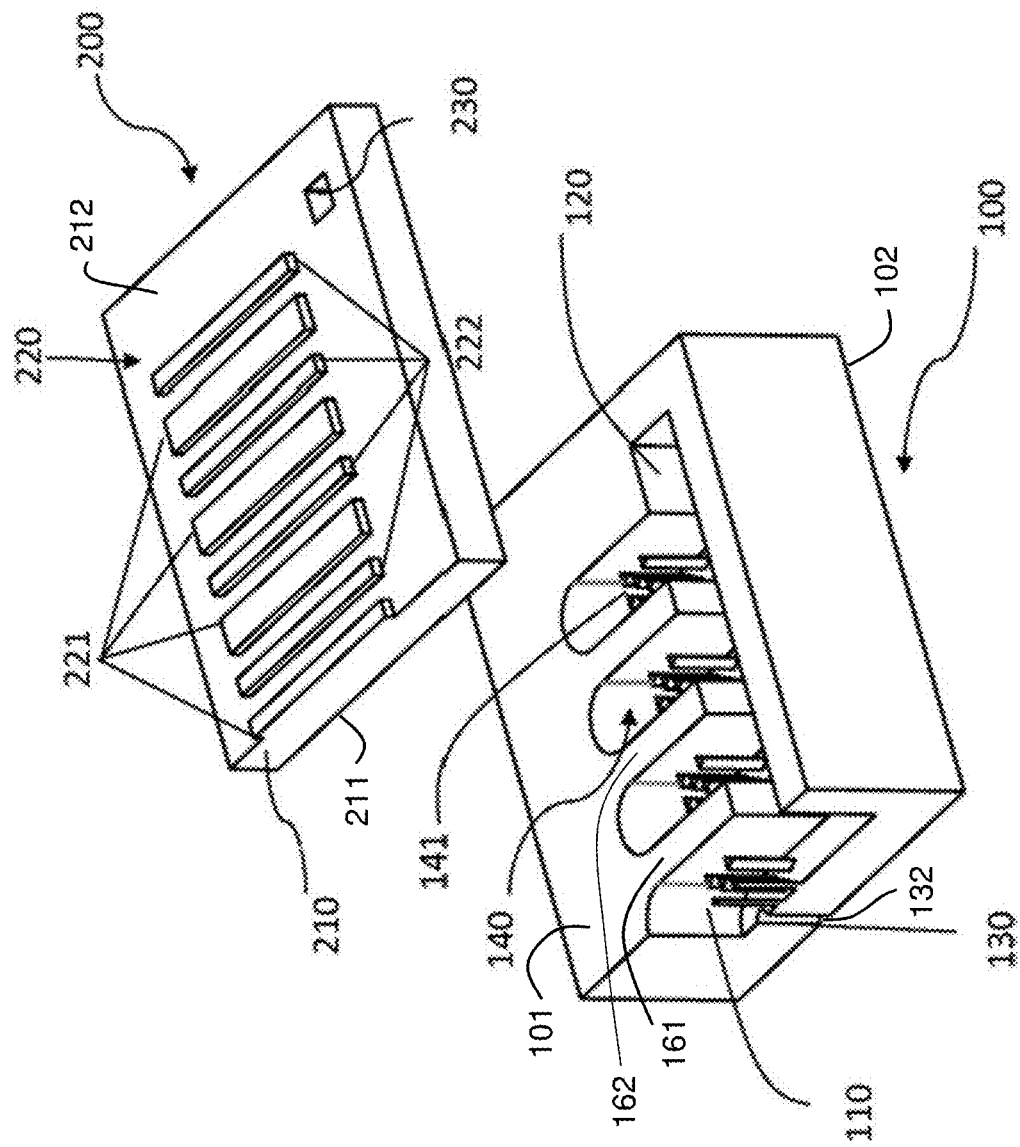
FIG. 1 – PRIOR ART

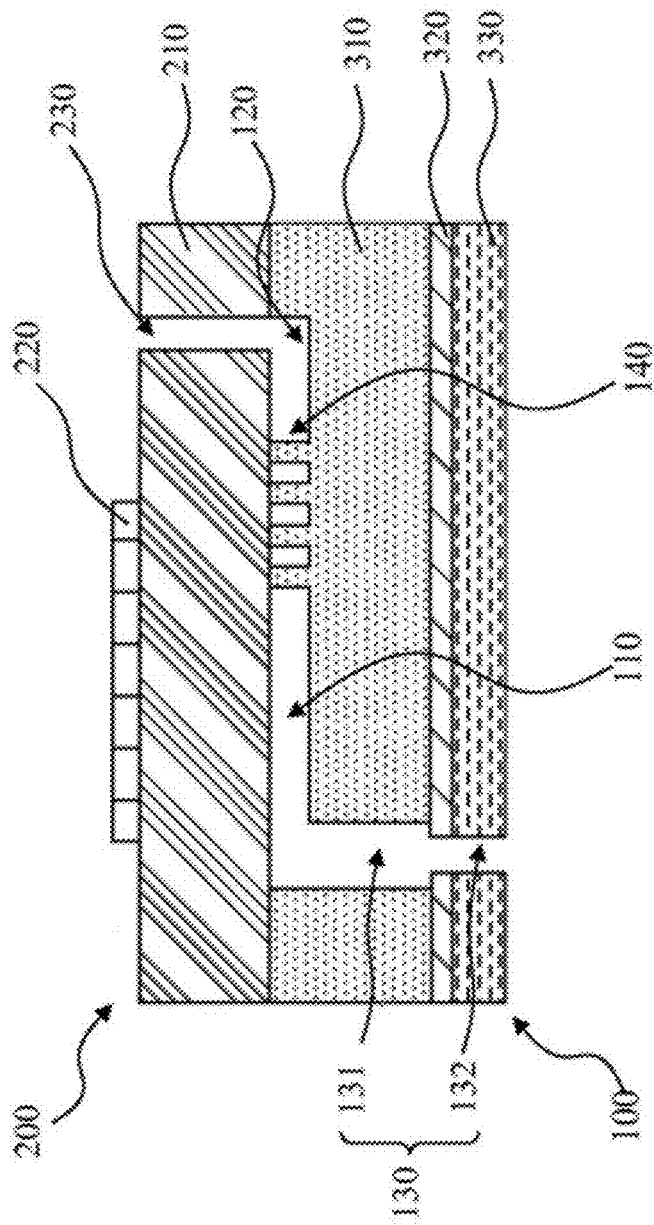
FIG. 2 – PRIOR ART

PIEZOELECTRIC PRINTHEAD AND PRINTING SYSTEM

CROSS REFERENCE TO RELATED APPLICATIONS

Reference is made to commonly assigned patent application Ser. No. 16/912,769, entitled: "Piezoelectric printing device with outer layer surface electrode" patent application Ser. No. 16/912,783, entitled: "Piezoelectric printing device with inner layer surface electrode"; patent application Ser. No. 16/912,816, entitled: "Piezoelectric printing device with vias through piezoelectric plate"; patent application Ser. No. 16/912,833, entitled: "Piezoelectric printhead for multiple inks and printing system"; and patent application Ser. No. 16/912,844, entitled: "Piezoelectric printing device with single layer inner electrode"; filed concurrently herewith, and incorporated herein by reference.

FIELD OF THE INVENTION

This invention pertains to the field of piezoelectric inkjet printing and more particularly to configurations of a piezoelectric printhead package.

BACKGROUND OF THE INVENTION

Inkjet printing is typically done by either drop-on-demand or continuous inkjet printing. In drop-on-demand inkjet printing ink drops are ejected onto a recording medium using a drop ejector including a pressurization actuator (thermal or piezoelectric, for example). Selective activation of the actuator causes the formation and ejection of a flying ink drop that crosses the space between the printhead and the recording medium and strikes the recording medium. The formation of printed images is achieved by controlling the individual formation of ink drops, as is required to create the desired image. The desired image can include any pattern of dots directed by image data. It can include graphic or text images. It can also include patterns of dots for printing functional devices or three dimensional structures if appropriate inks are used. Ink can include colored ink such as cyan, magenta, yellow or black. Alternatively ink can include conductive material, dielectric material, magnetic material, or semiconductor material for functional printing. Ink can include biological, chemical or medical materials.

Motion of the recording medium relative to the printhead during drop ejection can consist of keeping the printhead stationary and advancing the recording medium past the printhead while the drops are ejected, or alternatively keeping the recording medium stationary and moving the printhead. The former architecture is appropriate if the drop ejector array on the printhead can address the entire region of interest across the width of the recording medium. Such printheads are sometimes called pagewidth printheads. A second type of printer architecture is the carriage printer, where the printhead drop ejector array is somewhat smaller than the extent of the region of interest for printing on the recording medium and the printhead is mounted on a carriage. In a carriage printer, the recording medium is advanced a given distance along a medium advance direction and then stopped. While the recording medium is stopped, the printhead carriage is moved in a carriage scan direction that is substantially perpendicular to the medium advance direction as the drops are ejected from the nozzles. After the carriage-mounted printhead has printed a swath of the image while traversing the print medium, the recording medium is advanced; the carriage direction of motion is reversed; and the image is formed swath by swath.

A drop ejector in a drop-on-demand inkjet printhead includes a pressure chamber having an ink inlet for providing ink to the pressure chamber, and a nozzle for jetting drops out of the chamber. In a piezoelectric inkjet printing device, a wall of the pressure chamber includes a piezoelectric element that causes the wall to deflect into the ink-filled pressure chamber when a voltage pulse is applied, so that ink is forced through the nozzle. Piezoelectric inkjet has significant advantages in terms of chemical compatibility and ejection latitude with a wide range of inks (including aqueous-based inks, solvent-based inks, and ultraviolet-curing inks), as well as the ability to eject different sized drops by modifying the electrical pulse.

Piezoelectric printing devices also have technical challenges that need to be addressed. Because the amount of piezoelectric displacement per volt is small, the piezoelectric chamber wall area must be much larger than the nozzle area in order to eject useful drop volumes, so that each drop ejector is relatively large. The width of each drop ejector in a row of drop ejectors is limited by the nozzle spacing in that row. As a result, the pressure chambers typically have a length dimension that is much greater than the width dimension. Printing applications that require printing at high resolution and high throughput require large arrays of drop ejectors with nozzles that are closely spaced. Staggered rows of nozzles can provide dots at close spacing on the recording medium through appropriate timing of firing of each row of drop ejectors. However, with many staggered rows, the size of the piezoelectric printing device becomes large.

A further challenge is that, unlike thermal inkjet printing devices that typically include integrated logic and driving electronics so that the number of leads to the device is reduced, a piezoelectric printing device typically has individual electrical leads for each drop ejector that need to be connected to the driving electronics. In order to apply a voltage across the piezoelectric element independently for each drop ejector in order to eject drops when needed, each drop ejector needs to be associated with two electrodes. The two types of electrodes are sometimes called positive and negative electrodes, or individual and common electrodes for example.

Some types of piezoelectric printing devices are configured such that the two types of electrodes are on opposite surfaces of the piezoelectric element. For making electrical interconnection between the piezoelectric printing device and the driving electronics it can be advantageous to have the two types of electrodes on a same surface of the piezoelectric printing device.

U.S. Pat. No. 5,255,016 discloses a piezoelectric inkjet printing device in which positive and negative comb-shaped electrodes are formed on an outer surface of a piezoelectric plate. The teeth of the comb, at least in some regions, extend across the width of the drop ejector. A portion of the positive electrode extends along one side edge of the piezoelectric plate, and a portion of the negative electrode extends along an opposite side edge of the piezoelectric plate. Individual piezoelectric plates are provided for each drop ejector, resulting in a structure that would be unwieldy to manufacture with large arrays of drop ejectors at tight spacing.

U.S. Pat. No. 6,243,114 discloses a piezoelectric inkjet printing device in which the common electrode on an outer surface of the piezoelectric plate is comb-shaped with one electrode tooth extending along each side wall of the pressure chamber and a central common electrode tooth extending along the length of the pressure chamber. Two individual electrodes extend along the length of the pressure chamber on opposite sides of the central common electrode tooth.

U.S. Pat. No. 5,640,184 discloses a piezoelectric inkjet printing device in which pressure chambers for a row of nozzles extend alternately in opposite directions from the row of nozzles. A common electrode on a surface of the piezoelectric plate extends along the row of nozzles and has electrode teeth that extend alternately in opposite directions over the side walls of the pressure chambers. Interlaced between the electrode teeth of the common electrode is a spaced array of individual electrodes that are positioned directly over the pressure chambers. When a voltage is applied to an individual electrode, the piezoelectric plate is mechanically distorted in a shear mode toward the corresponding pressure chamber to cause ejection of an ink drop.

Chinese Patent Application Publication No. 107344453A discloses a piezoelectric inkjet printing device shown in FIGS. 1 and 2, which are taken from '453 with some additional labeling added to FIG. 1 for clarification. A substrate 100 includes a first side 101 in which a row of pressure chambers 110 is arranged. Each pressure chamber 110 is bounded by side walls 161 and 162. A channel 130 leads from pressure chamber 110 to a nozzle 132 that is disposed on a second side 102 of the substrate 100. The width of the pressure chamber 110 between side walls 161 and 162 is W. An ink groove 120 is fluidically connected to an end of each of the pressure chambers 110 in order to provide ink to them. A damping structure 140 including a plurality of pillars 141 is provided in each pressure chamber 110 between the ink groove 120 and the channel 130. A driving cover plate 200 includes a piezoelectric plate 210, made of lead zirconate titinate (PZT) for example. A first surface 211 of the piezoelectric plate 210 is bonded to the first side 101 of the substrate 100. An electrode layer 220 is disposed on an outer second surface 212 of the piezoelectric plate 210. The electrode layer 220 includes positive electrodes 221 that are each disposed over the length of the pressure chambers 110, as well as negative electrodes 222 that are disposed over the length of the side walls 161 and 162 between pressure chambers 110. An ink inlet port 230 is provided through the piezoelectric plate 210 to bring ink from an external ink supply to the ink groove 120 in the substrate 100. Nozzle 132 extends from a flow path 131 in silicon 310 through an oxide layer 320 and a nozzle layer 330 (FIG. 2).

What is needed is a printhead package that enables electrical connection to the many signal input pads as well as the ground return pads of a piezoelectric printing device, as well as fluidic connection, for connection to a printer in a space-efficient manner

SUMMARY OF THE INVENTION

According to an aspect of the present invention, a piezoelectric printhead includes a piezoelectric printing device, a manifold, a U-shaped flexible printed wiring element and an interconnection element. The piezoelectric printing device includes a piezoelectric plate and a substrate with an array of at least one row of drop ejectors, such that each row is aligned along a row direction. Each drop ejector includes a pressure chamber and a nozzle that is in fluid connection with the pressure chamber. The piezoelectric plate has a first surface disposed proximate to the pressure chambers and an outer second surface opposite to the first surface. The piezoelectric printing device includes at least one ink inlet port that provides ink to the pressure chambers. A signal line corresponding to each drop ejector leads to a corresponding signal input pad. At least one common ground bus is disposed along the row direction. The common ground bus is connected to ground traces that are disposed between adjacent pressure chambers. The at least one common ground bus leads to at least one ground return pad. The manifold is fluidically connected to the at least one ink inlet port. The U-shaped flexible printed wiring element includes a device connection region and a pair of legs that extend from the device connection region. The device connection region includes a plurality of signal connection pads, each signal connection pad facing a corresponding signal input pad; and at least one ground connection pad, each ground connection pad facing a corresponding ground return pad. The pair of legs includes a plurality of signal connection lines, each signal connection line extending from a corresponding signal connection pad; and at least one ground connection line, each ground connection line extending from a corresponding ground connection pad. The interconnection element is disposed between the device connection region of the U-shaped flexible printing wiring element and a contact layer of the piezoelectric printing device that includes the signal input pads and the at least one ground return pad.

According to another aspect of the present invention, a piezoelectric inkjet printing system includes a piezoelectric printhead, an image data source, a controller, an electrical pulse source, and a logic board. The piezoelectric printing device includes a piezoelectric plate and a substrate with an array of at least one row of drop ejectors, such that each row is aligned along a row direction. Each drop ejector includes a pressure chamber and a nozzle that is in fluid connection with the pressure chamber. The piezoelectric plate has a first surface disposed proximate to the pressure chambers and an outer second surface opposite to the first surface. The piezoelectric printing device includes at least one ink inlet port that provides ink to the pressure chambers. A signal line corresponding to each drop ejector leads to a corresponding signal input pad. At least one common ground bus is disposed along the row direction. The common ground bus is connected to ground traces that are disposed between adjacent pressure chambers. The at least one common ground bus leads to at least one ground return pad. The manifold is fluidically connected to the at least one ink inlet port. The U-shaped flexible printed wiring element includes a device connection region and a pair of legs that extend from the device connection region. The device connection region includes a plurality of signal connection pads, each signal connection pad facing a corresponding signal input pad; and at least one ground connection pad, each ground connection pad facing a corresponding ground return pad. The pair of legs includes a plurality of signal connection lines, each signal connection line extending from a corresponding signal connection pad; and at least one ground connection line, each ground connection line extending from a corresponding ground connection pad. The interconnection element is disposed between the device connection region of the U-shaped flexible printing wiring element and a contact layer of the piezoelectric printing device that includes the signal input pads and the at least one ground return pad. The logic board is connected to the U-shaped flexible printed wiring element.

This invention has the advantage that the printhead package facilitates electrical connection to the many signal input pads as well as the ground return pads for piezoelectric printing devices whether the electrodes are on an outer surface of the piezoelectric plate or on an inner surface of the piezoelectric printing device. The printhead package can be further advantageous in enabling the printhead electrical connection and fluidic connection to be similar enough for these different piezoelectric printing device types that the four piezoelectric printing device types can be used interchangeably in the same printer with few or no printer operational changes.

BRIEF DESCRIPTION OF THE DRAWINGS

FIG. 1 shows an exploded perspective view of a prior art piezoelectric drop ejector array configuration;

FIG. 2 shows a cross-section of a single drop ejector of the type shown in FIG. 1;

It is to be understood that the attached drawings are for purposes of illustrating the concepts of the invention and may not be to scale. Identical reference numerals have been used, where possible, to designate identical features that are common to the figures.

DETAILED DESCRIPTION OF THE INVENTION

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. It should be noted that, unless otherwise explicitly noted or required by context, the word "or" is used in this disclosure in a non-exclusive sense. Words such as "over", "under", "above" or "below" are intended to describe positional relationships of features that are in different planes, but it is understood that a feature of a device that is "above" another feature of the device in one orientation would be "below" that feature if the device is turned upside down.

Figure 3A:
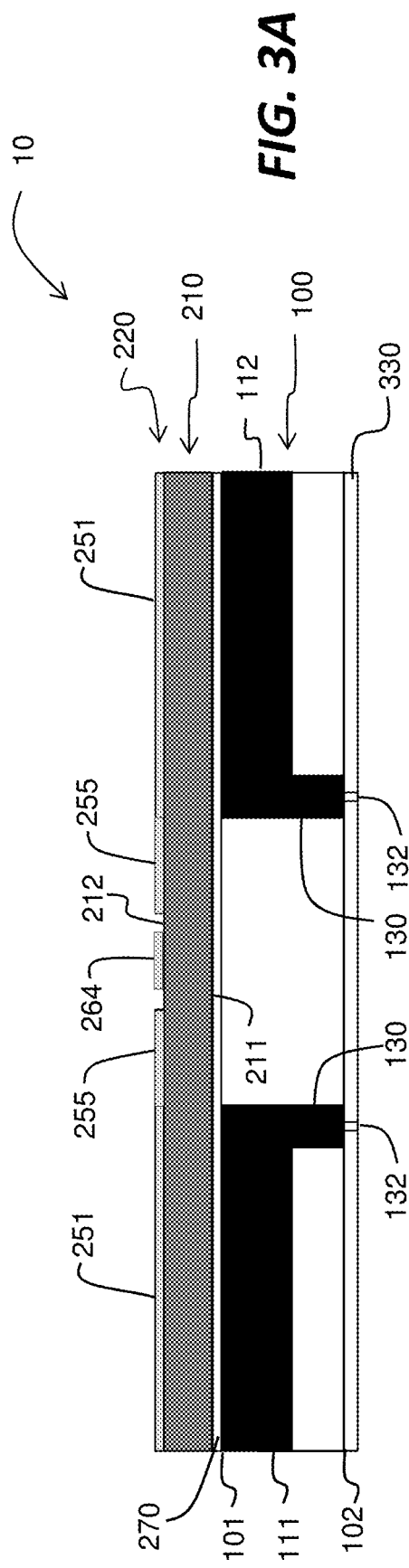
FIG. 3A shows a cross-section of a portion of a piezoelectric printing device having electrodes on an outer surface of a piezoelectric plate.
Figure 4:
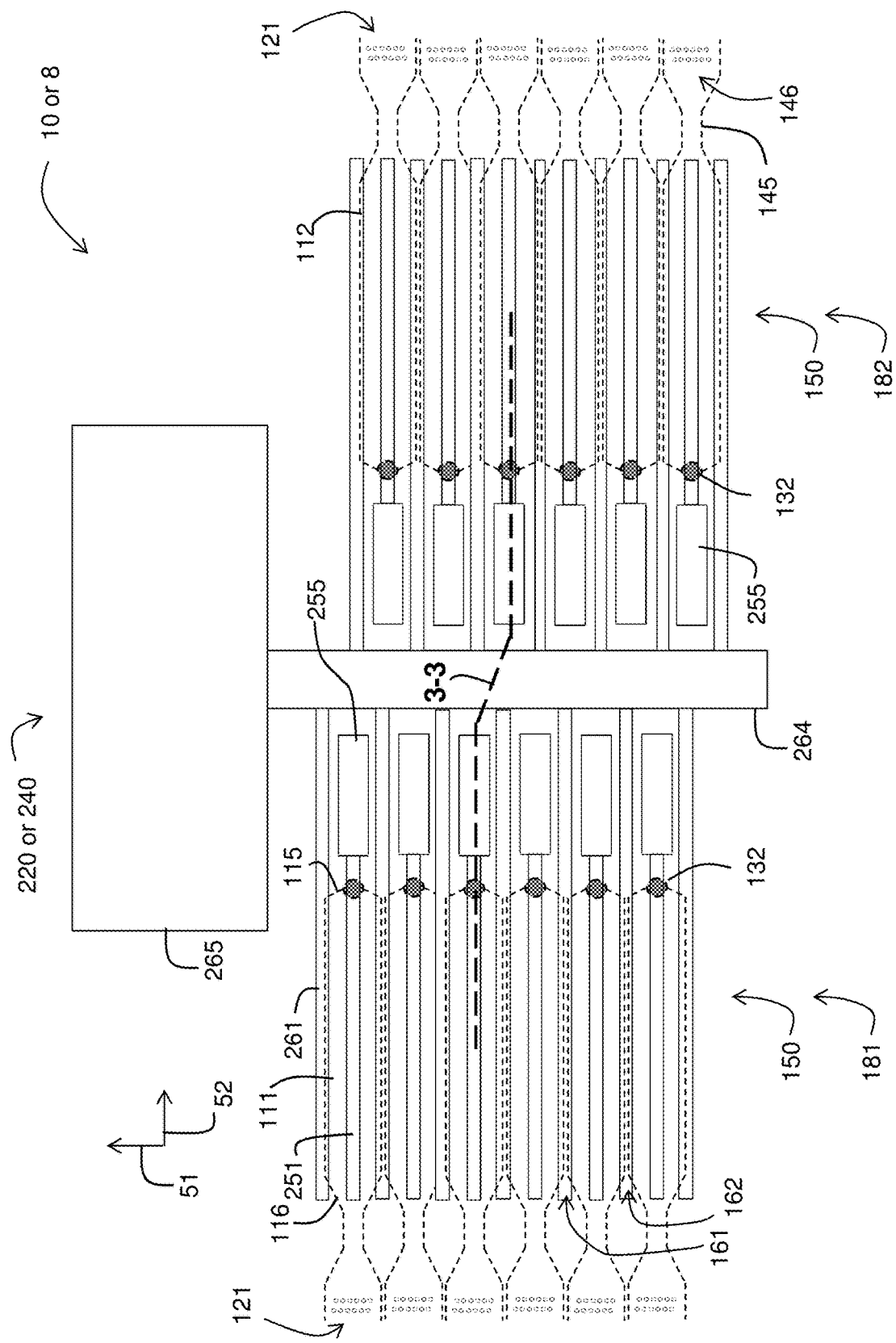
FIG. 4 shows a top view of the piezoelectric printing device of FIGS. 3A and 3B.

FIG. 3A shows a cross-section of a portion of a piezoelectric printing device 10 through dashed line 3-3 of FIG. 4 (see patent application Ser. No. 16/912,769). Piezoelectric printing device 10 includes a piezoelectric plate 210 having a first surface 211 that is structurally bonded to a first side 101 of substrate 100 by bonding layer 270. The bonding layer 270 can be a polymer adhesive, for example. Substrate 100 includes a pair of pressure chambers 111 and 112, which extend outwardly from a central region. Each pressure chamber 111 and 112 includes a channel 130 that leads to a nozzle 132 disposed in a nozzle layer 330 on second side 102 of substrate 100. An electrode layer 220 is disposed on an outer second surface 212 of the piezoelectric plate 210 and includes signal lines 251 that extend over pressure chambers 111 and 112.

Figure 3B:
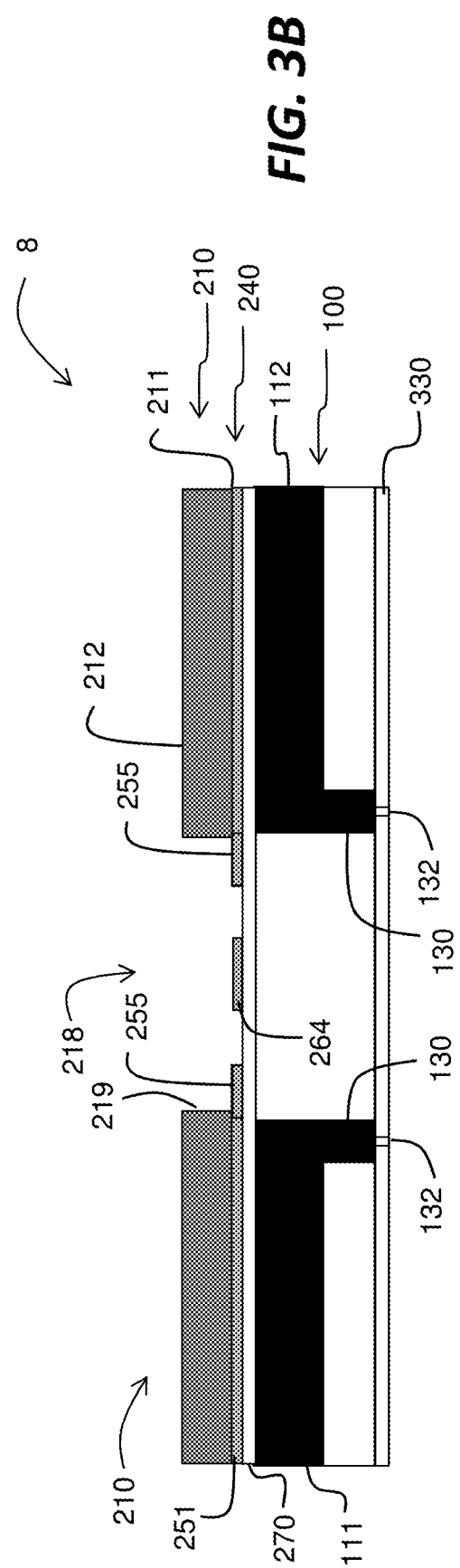
FIG. 3B shows a cross-section of a portion of a piezoelectric printing device having electrodes on an inner surface of a piezoelectric plate.

FIG. 3B shows a cross-section of a portion of a piezoelectric printing device 8 through dashed line 3-3 of FIG. 4 (see patent application Ser. No. 16/912,844). Piezoelectric printing device 8 has an electrode layer 240 on the inner first surface of the piezoelectric plate 210. The electrode layer includes signal lines, signal input pads, at least one common ground bus and at least one ground return pad. The opening 218 is formed in the piezoelectric plate 210 to expose the signal input pads and at least one ground return pad for electrical connection to the piezoelectric printing device 8.

With reference also to FIG. 4, piezoelectric printing device 10 or 8 includes a pair of staggered rows 181 and 182 of drop ejectors 150, each aligned along a row direction 51. Each staggered row 181 and 182 can include drop ejectors 150 at a density of 100 per inch, for example, so that the combined printing resolution along the row direction 51 can be 200 dots per inch. Each drop ejector 150 in first row 181 includes a pressure chamber 111, and each drop ejector 150 in second row 182 includes a pressure chamber 112. The nozzles 132 are disposed near a first end 115 of the pressure chambers 111 and 112. In the example shown in FIG. 4, ink is fed into the ink inlets 121 of each drop ejector 150 directly from the edges of substrate 100 that extend along row direction 51. Ink enters the pressure chambers through filter 146 and through restrictor 145 near second end 116 of pressure chambers 111 and 112 opposite the first end 115. Filter 146 can include pillars similar to the pillars 141 shown in prior art FIG. 1. Restrictor 145 provides flow impedance (as does filter 146) to help limit the flow of ink toward inlet 121 when a drop of ink is being ejected from pressure chamber 111 or 112, thereby directing more of the pressure of the deflecting piezoelectric plate 210 to propelling the drop of ink.

Signal lines 251 are disposed over each corresponding pressure chamber 111 and 112 and extend in a direction 52 that is perpendicular to the row direction 51. In the example shown in FIG. 4, signal lines 251 are disposed over centers of the corresponding pressure chambers 111 and 112. Each signal line leads to a corresponding signal input pad 255. In an example where the drop ejectors 150 in each row 181 and 182 are disposed at 100 per inch, nozzles 132 and their corresponding signal input pads 255 will have a spacing along row direction 51 of 0.010 inch. Ground traces 261 are aligned over the first side wall 161 and the second side wall 162 of the pressure chambers 111 and 112. Ground traces are typically disposed midway between corresponding pressure chambers and extend in a direction 52 that is perpendicular to row direction 51. Ground traces 261 lead to a common ground bus 264 that extends along row direction 51 and leads to a ground return pad 265.

Figure 5:
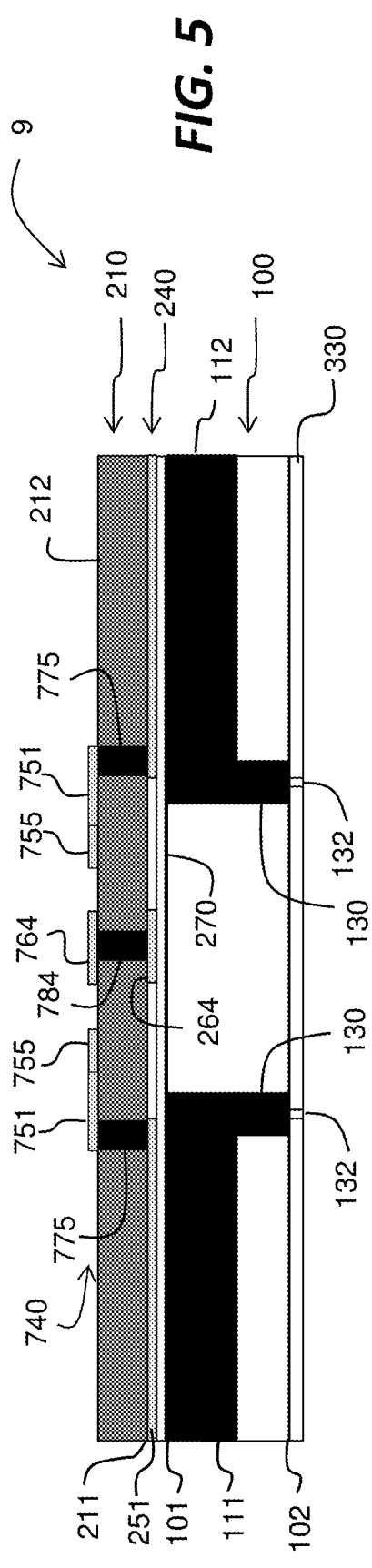
FIG. 5 shows a cross-section of a portion of another piezoelectric printing device having electrodes on an inner surface of a piezoelectric plate.
Figure 6:
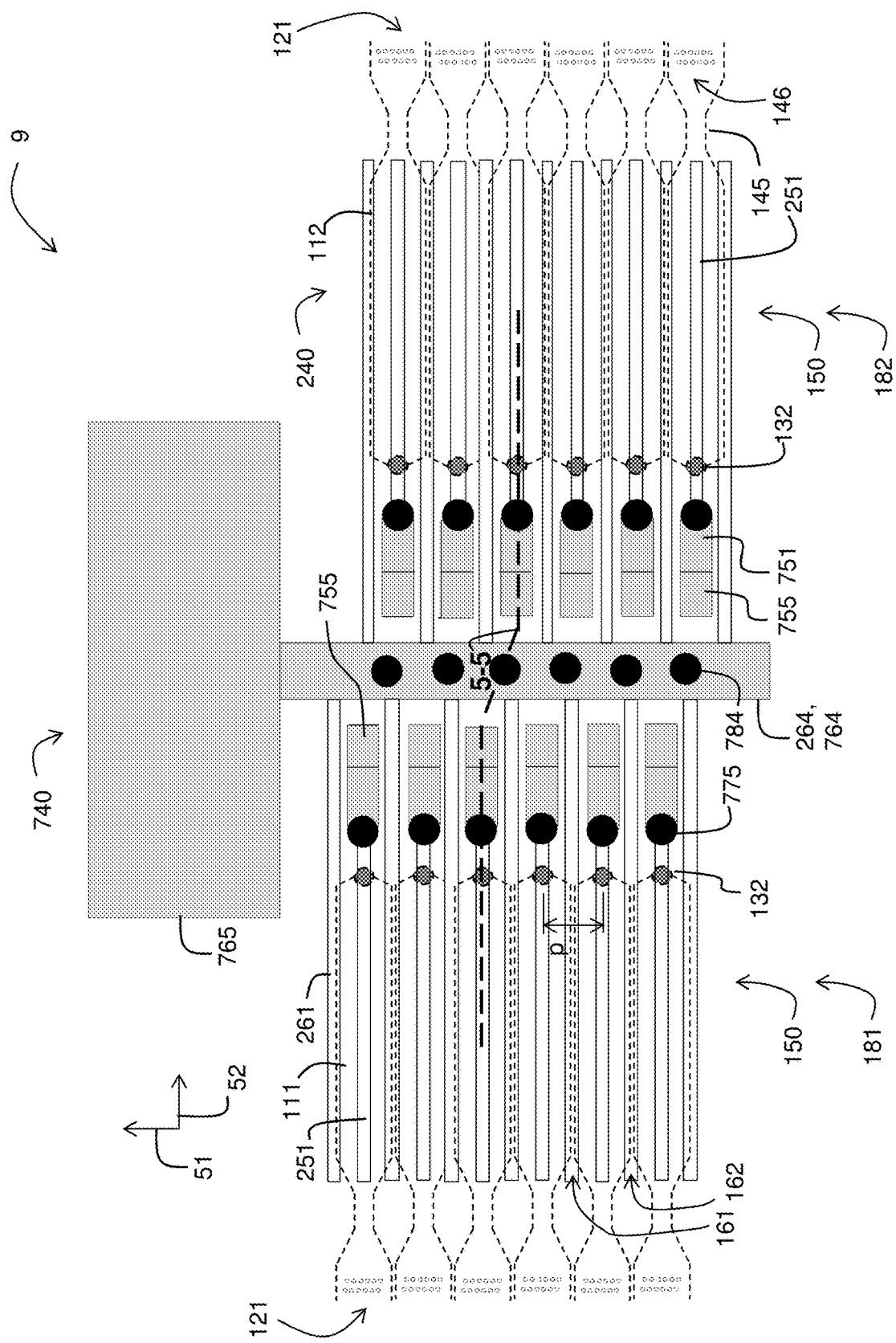
FIG. 6 shows a top view of the piezoelectric printing device of FIG. 5.

FIG. 5 shows a cross-section of a portion of a piezoelectric printing device 9 through dashed line 5-5 of FIG. 6 (see patent application Ser. No. 16/912,816). Piezoelectric printing device 9 includes a substrate 100, an array of at least one row 181 or 182 of drop ejectors 150, a piezoelectric plate 210, a bonding layer 270, a first electrode layer 240, a second electrode layer 740, and at least one common ground bus 264 or 764. With reference also to FIG. 6, each row 181 and 182 of drop ejectors 150 is aligned along a row direction 51. Each staggered row 181 and 182 can include drop ejectors 150 at a density of 100 per inch, for example, so that the combined printing resolution along the row direction 51 can be 200 dots per inch. Each drop ejector 150 includes a pressure chamber 111 or 112 disposed on a first side 101 of the substrate 100. The pressure chamber is bounded by a first side wall 161 and a second side wall 162. Each drop ejector 150 also includes a nozzle 132 disposed in a nozzle layer 330 that is disposed on a second side 102 of the substrate 100 opposite to the first side 101. In the example shown in FIG. 6, ink is fed into the ink inlets 121 of each drop ejector 150 directly from the edges of substrate 100 that extend along row direction 51.

The piezoelectric plate 210 (FIG. 5) has a first surface 211 that is proximate to the first side 101 of the substrate 100 and an outer second surface 212 opposite to the first surface 211. A first set and a second set of electrically conductive vias extend from the first surface 211 to the outer second surface 212. First electrode layer 240 is disposed on the first surface 211 of the piezoelectric plate. First electrode layer 240 includes a first signal line 251 corresponding to each pressure chamber 111 or 112. Each first signal line 251 is electrically connected to a corresponding signal via 775 of the first set of conductive vias. First electrode layer 240 also includes ground traces 261 that are disposed over the side walls 161 and 162 of each pressure chamber 111 and 112. Ground traces 261 are electrically connected to at least one corresponding ground via 784 of the second set of conductive vias. Second electrode layer 740 is disposed on the second surface 212 of the piezoelectric plate 210. Second electrode layer 740 includes a second signal line 751 and signal input pad 755 corresponding to each first signal line 251, where each signal input pad 755 is connected to a corresponding signal via 775 of the first set of conductive vias through a second signal line 751. With reference also to FIG. 6, second electrode layer 740 further includes at least one ground return pad 765 that is electrically connected to a plurality of ground vias 784 of the second set of conductive vias. The at least one ground return pad 765 is electrically connected to the at least one common ground bus 264 or 764. Bonding layer 270 is disposed between first electrode layer 240 and first side 101 of substrate 100. Bonding layer 270 joins piezoelectric plate 210 to the first side 101 of substrate 100. In addition, bonding layer 270 isolates the ink in pressure chambers 111 and 112 from the electrical lines and the piezoelectric plate 210.

Figure 7:
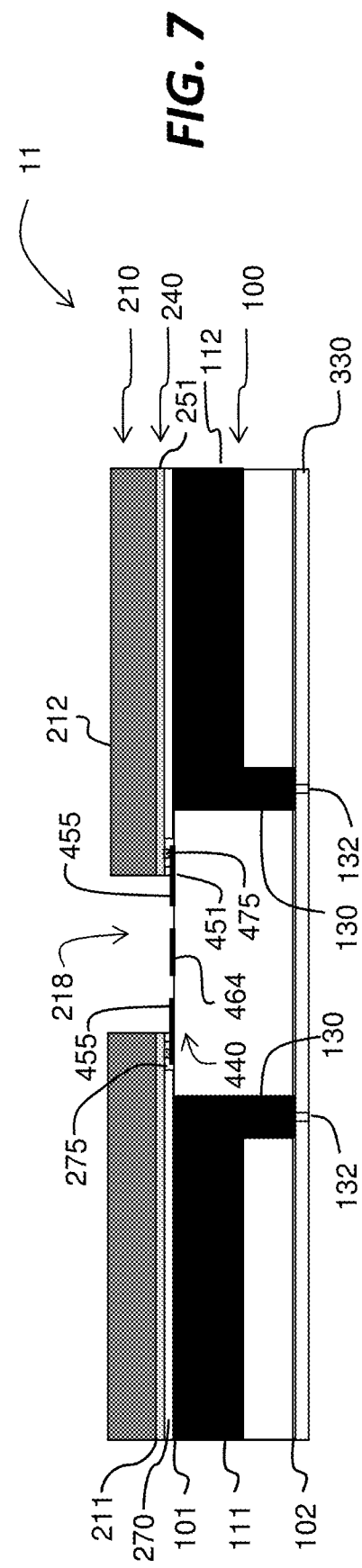
FIG. 7 shows a cross-section of a portion of an additional piezoelectric printing device having electrodes on an inner surface of a piezoelectric plate.
Figure 8:
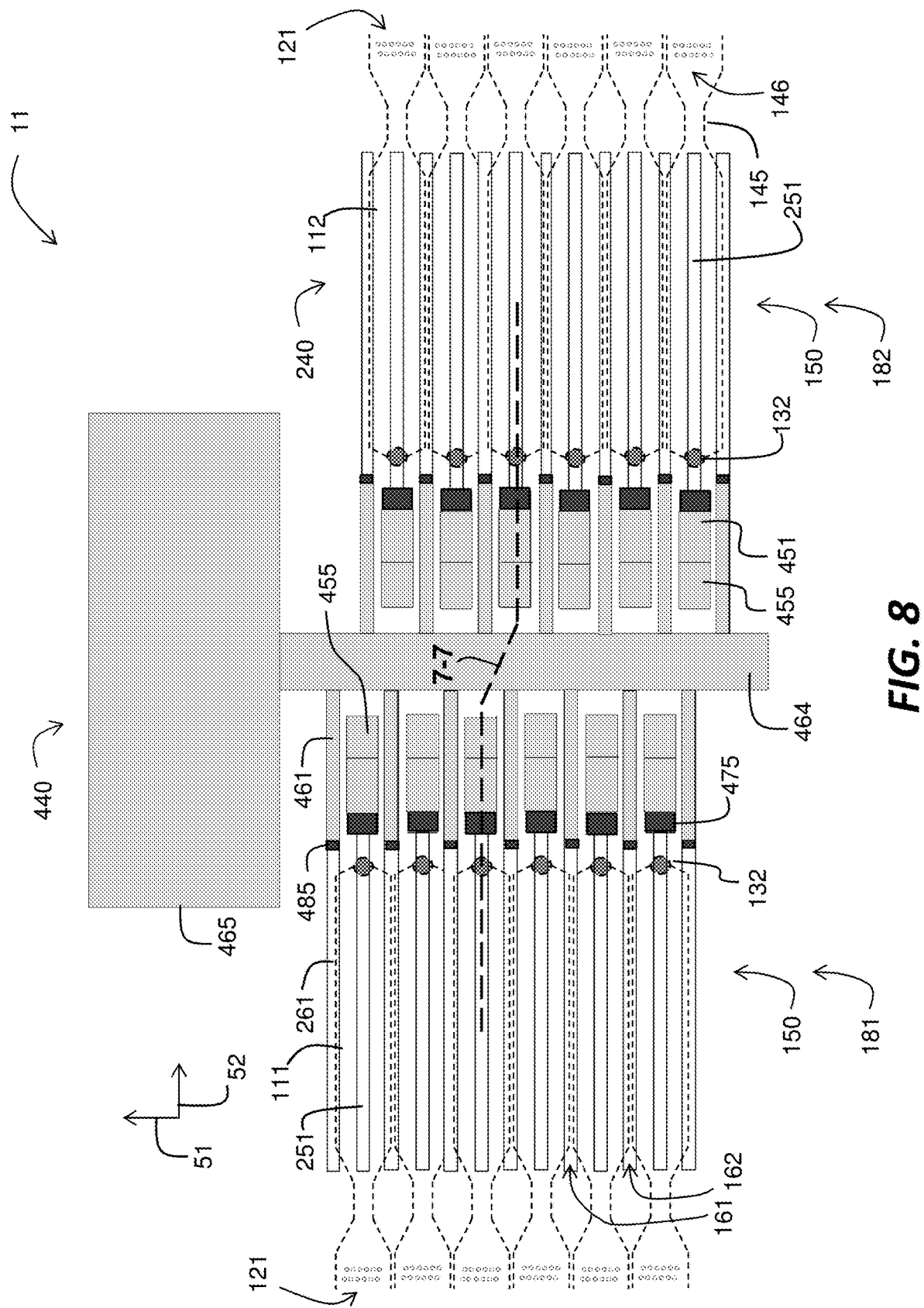
FIG. 8 shows a top view of the piezoelectric printing device of FIG. 7.

FIG. 7 shows a cross-section of a portion of a piezoelectric printing device 11 through dashed line 7-7 of FIG. 8 (see patent application Ser. No. 16/912,783). With reference also to FIG. 8, piezoelectric printing device 11 includes a substrate 100, a first row 181 of and a second row 182 of drop ejectors 150, a piezoelectric plate 210, a bonding layer 270, a first electrode layer 240, a second electrode layer 440, and at least one common ground bus 464. Each row 181 and 182 of drop ejectors 150 is aligned along a row direction 51. Each staggered row 181 and 182 can include drop ejectors 150 at a density of 100 per inch, for example, so that the combined printing resolution along the row direction 51 can be 200 dots per inch. Each drop ejector 150 includes a pressure chamber 111 or 112 disposed on a first side 101 of the substrate 100. The pressure chamber is bounded by a first side wall 161 and a second side wall 162. Each drop ejector 150 also includes a nozzle 132 disposed in a nozzle layer 330 that is disposed on a second side 102 of the substrate 100 opposite to the first side 101. In the example shown in FIG. 8, ink is fed into the ink inlets 121 of each drop ejector 150 directly from the edges of substrate 100 that extend along row direction 51.

The piezoelectric plate 210 (FIG. 7) has a first surface 211 that is proximate to the first side 101 of the substrate 100. First electrode layer 240 is disposed on the first surface 211 of the piezoelectric plate. First electrode layer 240 includes a first signal line 251 corresponding to each pressure chamber 111 and 112. Each first signal line 251 leads to a corresponding signal solder joint 475. First electrode layer 240 also includes ground traces 261 that are disposed over the side walls 161 and 162 of each pressure chamber 111 and 112. Ground traces 261 are electrically connected to ground solder joints 485. Bonding layer 270 is disposed between first electrode layer 240 and first side 101 of substrate 100 and has a bonding layer window 275 corresponding to each signal solder joint 475 and each ground solder joint 485. Second electrode layer 440 is disposed on the first side 101 of the substrate 100. Second electrode layer 440 includes a second signal line 451 corresponding to each first signal line 251. Each second signal line 451 leads to a corresponding signal input pad 455. In an example where the drop ejectors 150 in each row 181 and 182 are disposed at 100 per inch, nozzles 132 and their corresponding signal input pads 255 will have a spacing along row direction 51 of 0.010 inch. First signal lines 251 are electrically connected to corresponding second signal lines 451 through signal solder joints 475. Second electrode layer 440 also includes ground leads 461. Each ground lead 461 is electrically connected to a corresponding ground trace 261 through a ground solder joint 485. Second electrode layer 440 further includes at least one ground return pad 465 that is electrically connected to a plurality of ground leads 461 through at least one common ground bus 464. A portion of piezoelectric plate 210 is removed to form an opening 218 to expose pads for electrically connecting the assembled piezoelectric printing device.

Figure 9:
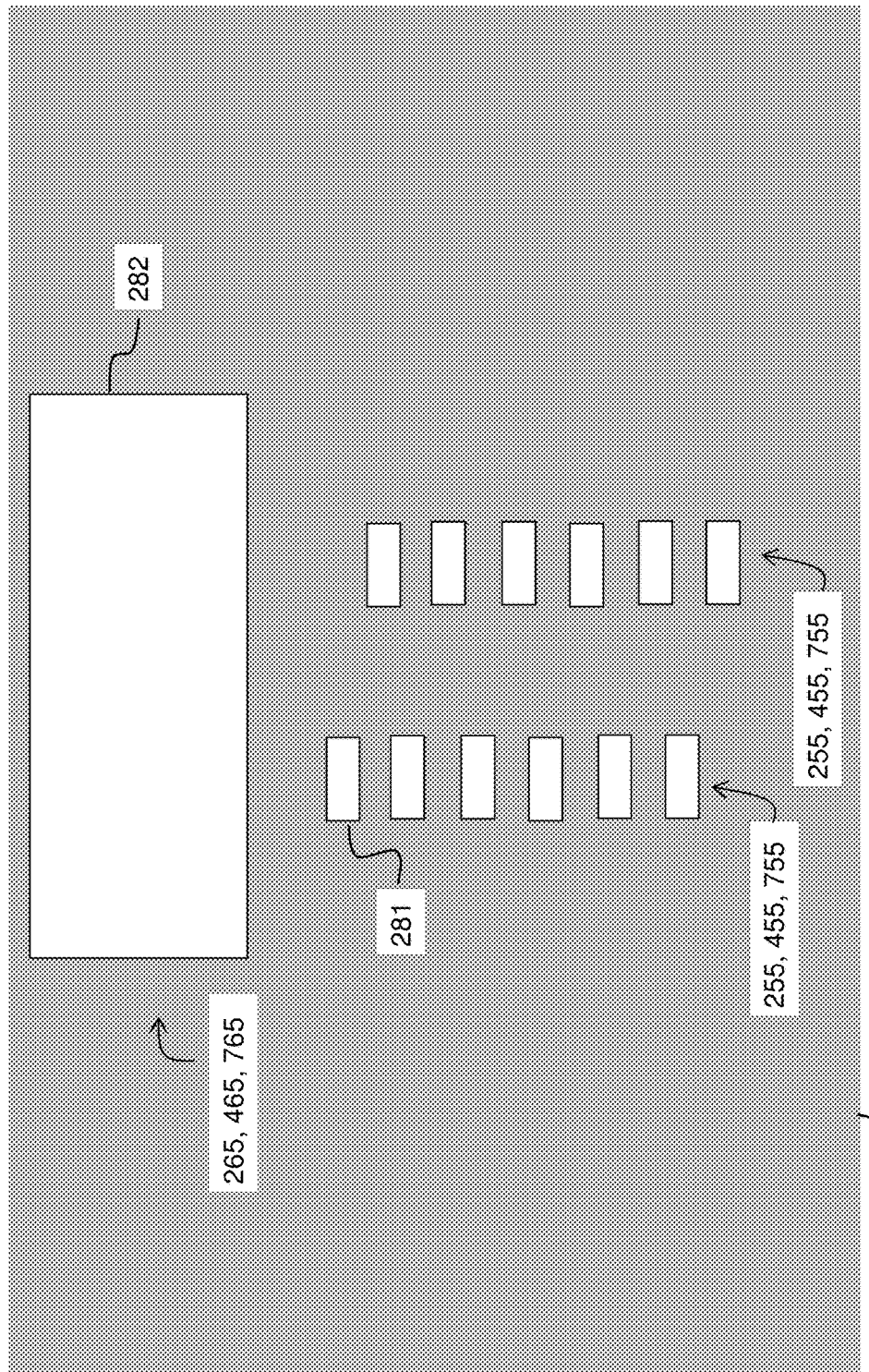
FIG. 9 shows a masking layer with windows.

As shown in the top view of FIG. 9, in order to provide more reliable electrical interconnection without shorts, a masking layer 280 can be disposed over the electrode layer 220 or 240 on second surface 212 or first surface 211 of piezoelectric plate 210 of piezoelectric device 10 or 8 (FIGS. 3A, 3B and 4), such that the masking layer 280 includes windows 281 over the signal input pads 255 and a window 282 over the ground return pad 265 in order to expose the pads for electrical interconnection. Similarly a masking layer 280 can be disposed over the electrode layer 740 on second surface 212 of piezoelectric plate 210 of piezoelectric device 9 (FIGS. 5 and 6), such that the masking layer 280 includes windows 281 over the signal input pads 755 and a window 282 over the ground return pad 765 in order to expose the pads for electrical interconnection. Similarly a masking layer 280 can be disposed over the second electrode layer 440 on first side 101 of substrate 100 of piezoelectric device 11 (FIGS. 7 and 8), such that the masking layer 280 includes windows 281 over the signal input pads 455 and a window 282 over the ground return pad 465 in order to expose the pads for electrical interconnection.

Figure 10:
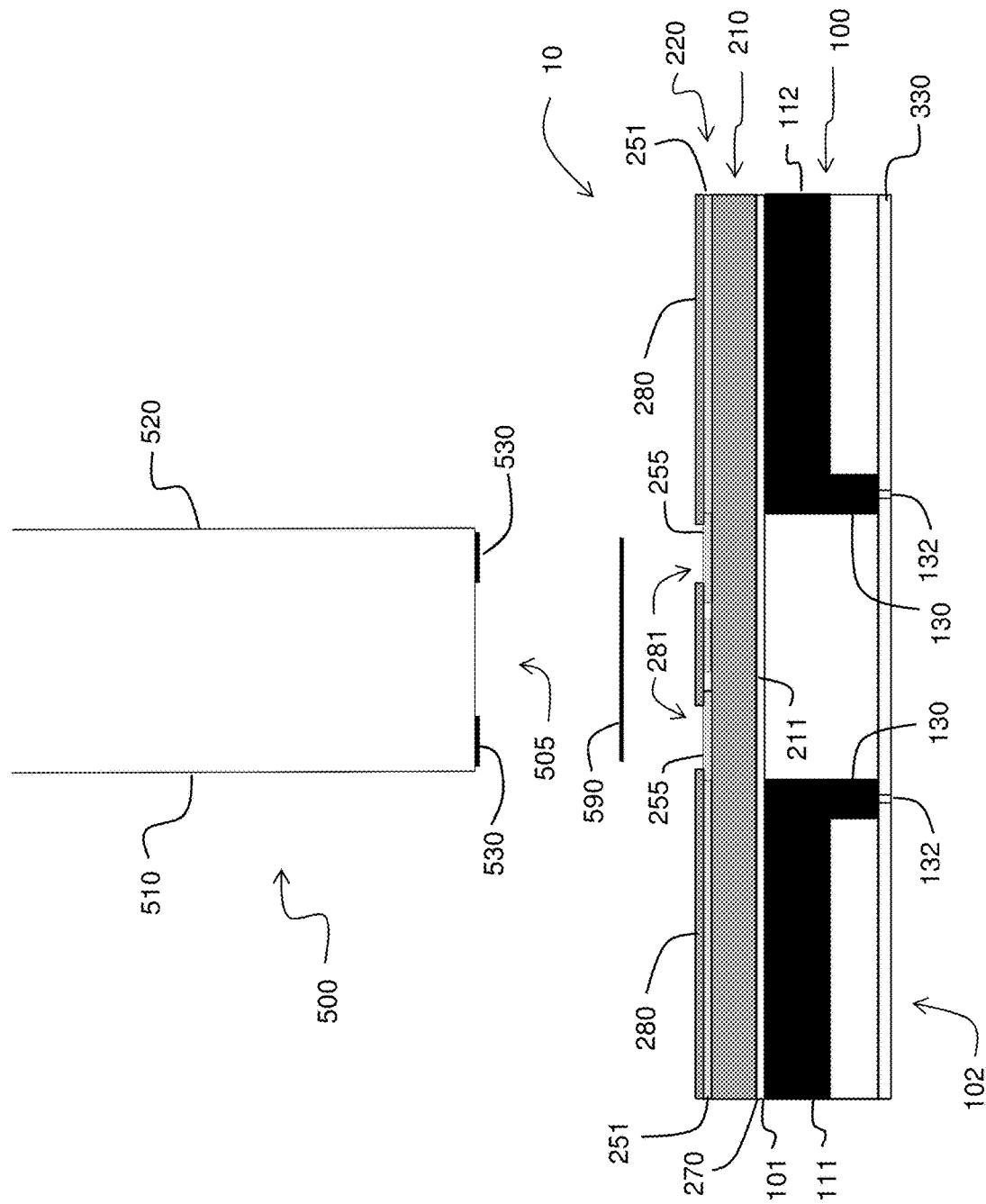
FIG. 10 shows an example of electrical connection to the piezoelectric printing device of FIG. 3A with a U-shaped flexible printed wiring element.

FIG. 10 illustrates a cross-sectional view of electrical connection to the piezoelectric printing device 10 shown in FIGS. 3A and 4. In piezoelectric printing device 10 the signal input pads 255 and the at least one ground return pad 265 (FIG. 4) are included in electrode layer 220 that is disposed on the outer second surface 212 of the piezoelectric plate. Herein, the layer that includes the signal input pads and the ground electrode pad(s) will also be referred to as a contact layer. A U-shaped flexible printed wiring element 500 includes a device connection region 505 at its base that has a plurality of signal connection pads 530 and at least one ground connection pad 540 (FIG. 13). Each signal connection pad 530 faces a corresponding signal input pad 255. In a similar fashion, each ground connection pad 540 (FIG. 13) faces a corresponding ground return pad 265 (FIG. 4). A pair of legs (first leg 510 and second leg 520) of the U-shaped flexible printed wiring element 500 extend from the device connection region 505 as described in more detail below with reference to FIGS. 12 and 13. An interconnection element 590 is disposed between the device connection region 505 and the contact layer (electrode layer 220) that includes the signal input pads 255 and ground return pad(s) 265. Interconnection element 590 can include an anisotropic conductive film that can be cured between device connection region 505 and the signal input pads 255 and ground return pad(s) 265. An anisotropic conductive film provides electrical connection through the thickness of interconnection element 590 without providing lateral conduction along the interconnection element 590 so that electrical shorts are avoided. Interconnection element 590 is flexible before curing and can be pressed into conformable contact with the contact layer through masking layer windows 281 and 282 (FIG. 9). Electrical interconnection to signal input pads 755 and ground return pad 765 on outer second surface 212 of the piezoelectric plate of piezoelectric printing device 9 (FIGS. 5 and 6) can be made in similar fashion.

Figure 11:
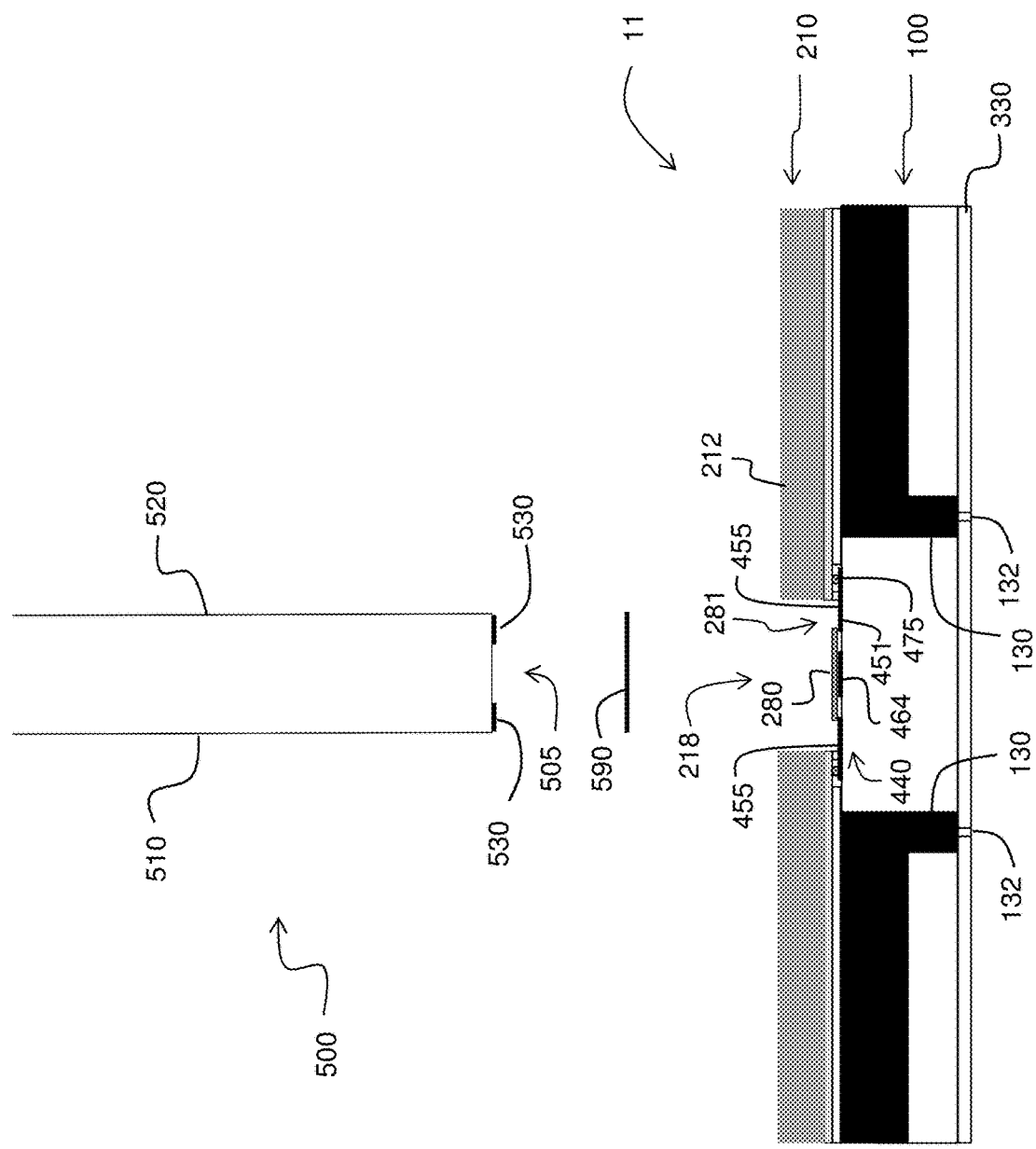
FIG. 11 shows an example of electrical connection to the piezoelectric printing device of FIG. 7 with a U-shaped flexible printed wiring element.

FIG. 11 illustrates a cross-sectional view of electrical connection to the piezoelectric printing device 11 shown in FIGS. 7 and 8. In piezoelectric printing device 11 the signal input pads 455 and the at least one ground return pad 465 (FIG. 8) are included in second electrode layer 440 (i.e. the contact layer) that is disposed on the first side 101 of the substrate 100. A U-shaped flexible printed wiring element 500 includes a device connection region 505 at its base that has a plurality of signal connection pads 530 and at least one ground connection pad 540 (FIG. 13). Each signal connection pad 530 faces a corresponding signal input pad 455. In a similar fashion, each ground connection pad 540 (FIG. 13) faces a corresponding ground return pad 465 (FIG. 8). The device connection region 505 is sufficiently narrow that it can extend through opening 218 of piezoelectric plate 210 in order to make connection to signal input pads 455 and the at least one ground return pad 465. A pair of legs (first leg 510 and second leg 520) of the U-shaped flexible printed wiring element 500 extend from the device connection region 505. An interconnection element 590, such as an anisotropic conductive film, is disposed between the device connection region 505 and the contact layer (second electrode layer 440) that includes the signal input pads 455 and ground return pad(s) 465. Interconnection element 590 is flexible before curing and can be pressed into conformable contact with the contact layer through opening 218 in piezoelectric plate 210 and through masking layer windows 281 and 282 (FIG. 9). Electrical interconnection to signal input pads 255 and ground return pad 265 on inner first surface 211 of the piezoelectric plate of piezoelectric printing device 8 (FIGS. 3B and 4) can be made in similar fashion.

Figure 12:
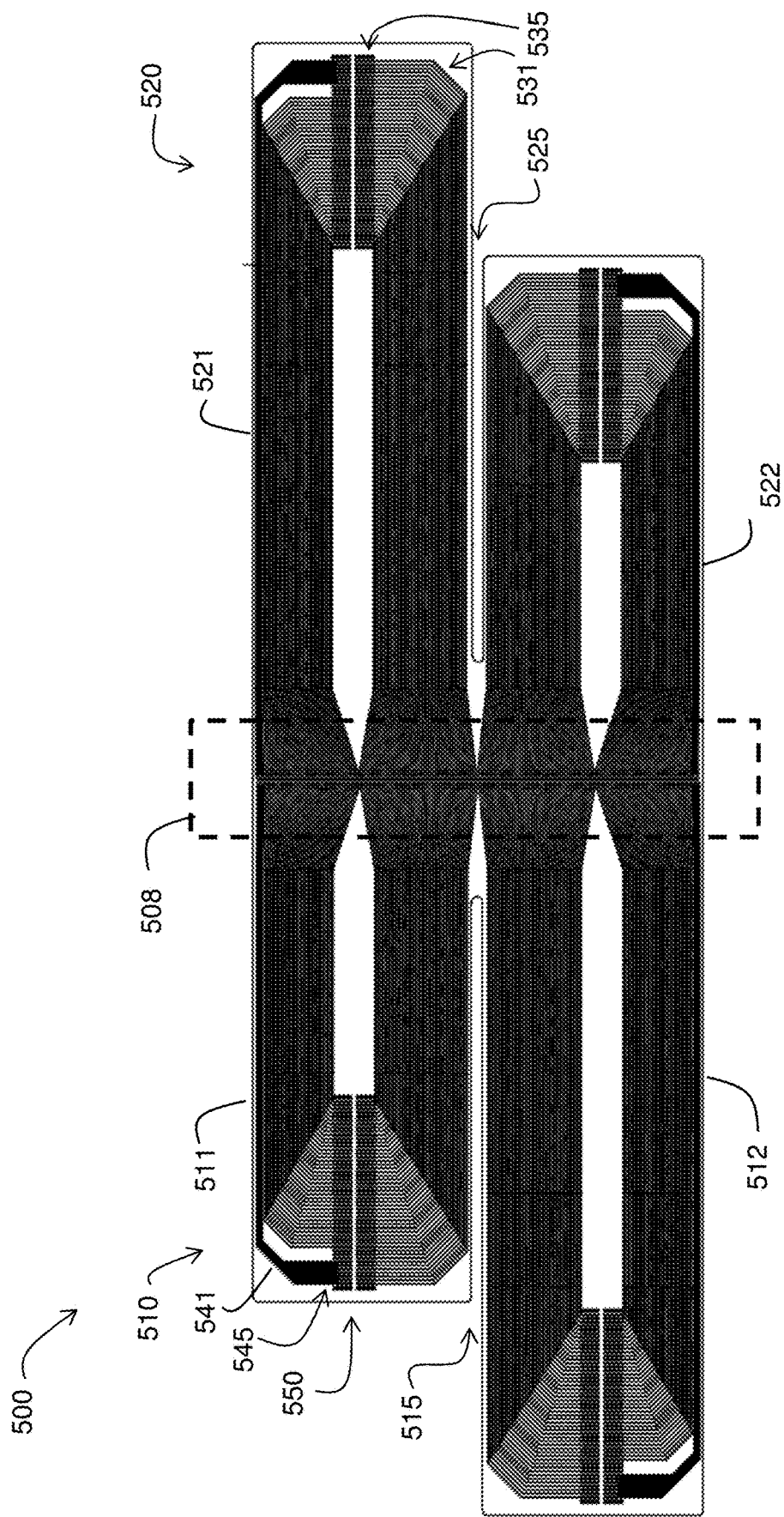
FIG. 12 shows a flexible printed wiring element for electrical connection to the piezoelectric printing devices of FIGS. 3A, 3B, 5 and 7.
Figure 13:
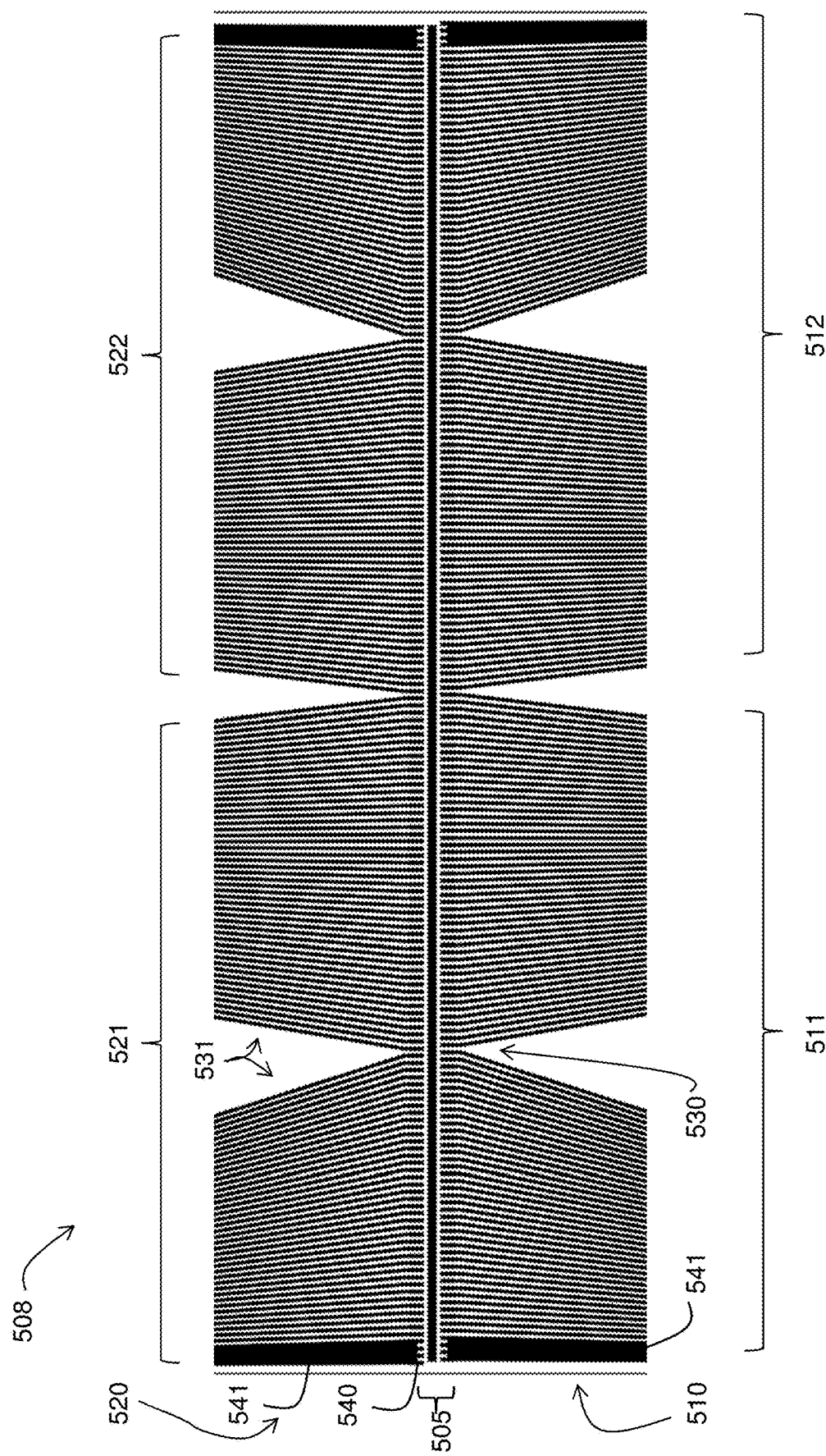
FIG. 13 shows a central region of the flexible printed wiring element of FIG. 12 at higher magnification and rotated 90 degrees.

FIG. 12 shows an example of flexible printed wiring element 500 prior to folding it in to a U shape. In FIG. 12 first leg 510 extends toward the left and second leg 520 extends toward the right. First leg 510 is bifurcated into a first portion 511 and a second portion 512 that are separated from each other by notch 515 for independent flexing. Similarly, second leg 520 is bifurcated into a first portion 521 and a second portion 522 that are separated from each other by notch 525. Each leg 510 and 520 includes signal connection lines 531 that lead to signal connector pads 535 in connector attachment regions 550. Similarly, each leg 510 and 520 includes ground connection lines 541 that lead to ground connector pads 545 in connector attachment regions 550. There are four connector attachment regions 550 for mounting connectors, one on each portion of each leg 510 and 520 as described below.

A central region 508 of flexible printed wiring element 500 is shown in FIG. 13 at higher magnification and rotated counterclockwise by 90 degrees. In the example shown in FIG. 13, there are ninety signal connection lines 531 in each of first and second portions 511 and 512 of first leg 510 and also ninety signal connection lines 531 in each of first and second portions 521 and 522 of second leg 520. Such a configuration is suitable for connecting to a piezoelectric printing device 8 or 10 (FIG. 4) having a total of three hundred and sixty drop ejectors 150, half of which are disposed in first row 181 and the other half of which are disposed in second row 182. Such a configuration is also suitable for connecting to a piezoelectric printing device 9 (FIG. 6) or a piezoelectric printing device 11 (FIG. 8) having a total of three hundred and sixty drop ejectors 150, half of which are disposed in first row 181 and the other half of which are disposed in second row 182. As shown in FIG. 13, each signal connection line 531 extends from a corresponding signal connection pad 530 and each ground connection line 541 extends from a corresponding ground connection pad 540. Each of the four connector attachment regions includes ninety signal connection pads 530 and several ground connection pads 540.

For piezoelectric printing device 8 or 10 shown in FIG. 4, signal connection pads 530 in first leg 510 can connect to signal input pads 255 corresponding to drop ejectors 150 in first row 181, and signal connection pads 530 in second leg 520 can connect to signal input pads 255 corresponding to drop ejectors 150 in second row 182.

For piezoelectric printing device 9 shown in FIG. 6, signal connection pads 530 in first leg 510 can connect to signal input pads 755 corresponding to drop ejectors 150 in first row 181, and signal connection pads 530 in second leg 520 can connect to signal input pads 755 corresponding to drop ejectors 150 in second row 182.

For piezoelectric printing device 11 shown in FIG. 8, signal connection pads 530 in first leg 510 can connect to signal input pads 455 corresponding to drop ejectors 150 in first row 181, and signal connection pads 530 in second leg 520 can connect to signal input pads 455 corresponding to drop ejectors 150 in second row 182.

Figure 14:
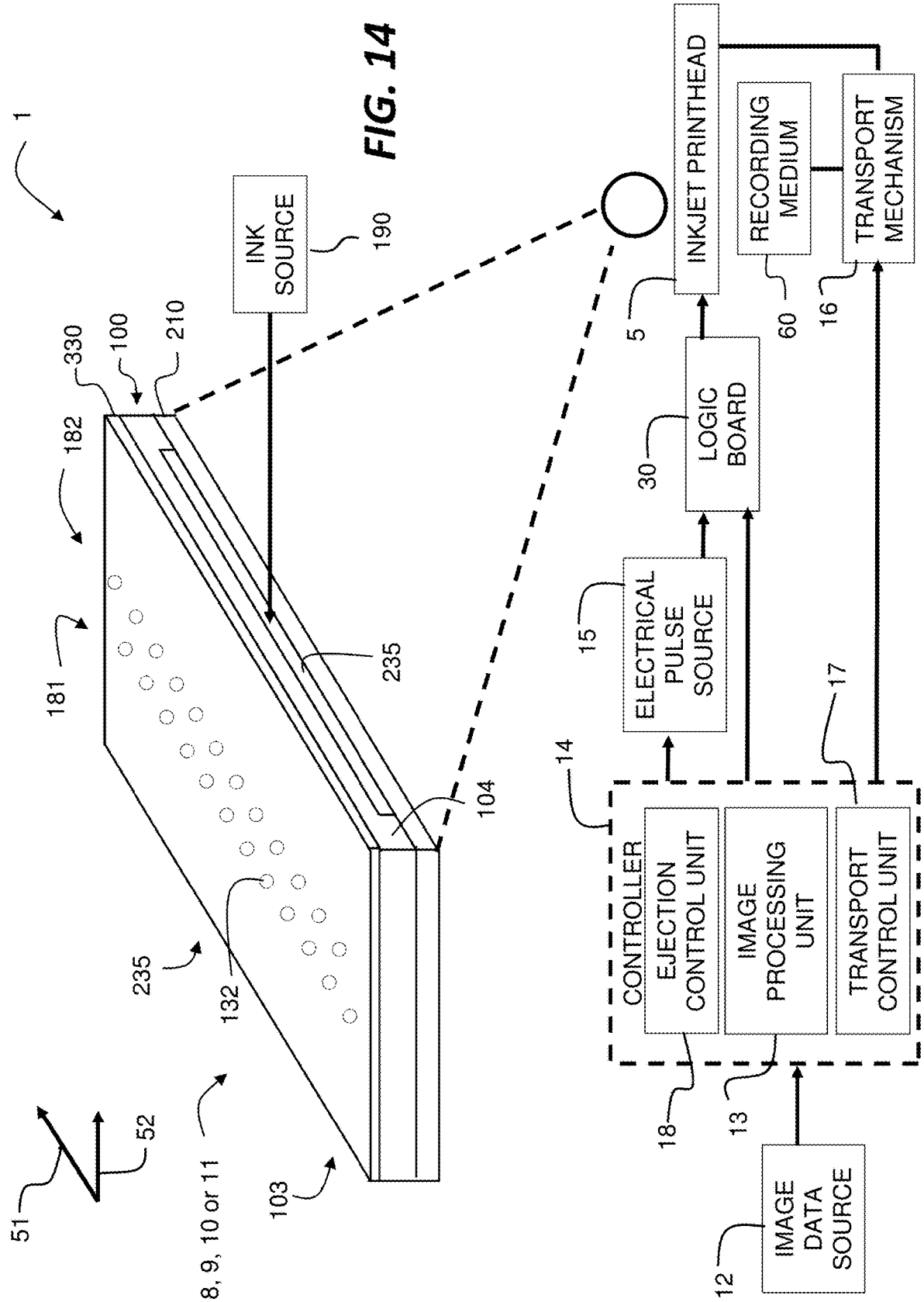
FIG. 14 shows a schematic representation of an inkjet printing system together with a perspective of a piezoelectric printing device.

FIG. 14 shows a schematic representation of an inkjet printing system 1 together with a perspective of a portion of piezoelectric printing device 8, 9, 10 or 11. Image data source 12 provides image data signals that are interpreted by a controller 14 as commands for ejecting drops. Controller 14 includes an image processing unit 13 for rendering images for printing. The term "image" is meant herein to include any pattern of dots directed by the image data. It can include graphic or text images. It can also include patterns of dots for printing functional devices or three dimensional structures if appropriate inks are used. Controller 14 also includes a transport control unit 17 for controlling transport mechanism 16 and an ejection control unit 18 for ejecting ink drops to print a pattern of dots corresponding to the image data onto the recording medium 60. Controller 14 sends output signals to an electrical pulse source 15 for sending electrical pulse waveforms to an inkjet printhead 5 that includes a piezoelectric printing device 8, 9, 10 or 11. Transport mechanism 16 provides relative motion between inkjet printhead 5 and recording medium 60 along a direction 52. Transport mechanism 16 is configured to move the recording medium 60 along direction 52 while the printhead 5 is stationary in some embodiments. Alternatively, transport mechanism 16 can move the printhead 5, for example on a carriage, back and forth past stationary recording medium 60. Because a piezoelectric printing device typically does not include integrated logic circuitry, a logic board 30 can be helpful for facilitating electrical connection between the controller 14 and the inkjet printhead 5, as described below with reference to FIG. 25. This can be especially helpful in a carriage printer in order to reduce the number of leads that need to be moved as the printhead 5 is moved back and forth relative to the recording medium 60. Various types of recording media 60 for inkjet printing include paper, plastic, and textiles. In a 3D inkjet printer, the recording medium 60 includes a flat building platform and a thin layer of powder material. In addition, in various embodiments recording medium 60 can be web fed from a roll or sheet fed from an input tray.

Piezoelectric printing device 8, 9, 10 or 11 includes at least one pair of rows 181 and 182 having a plurality of drop ejectors 150 (FIGS. 4, 6 and 8). For simplicity in FIG. 14, location of the drop ejectors 150 is represented by the circular nozzles 132, which are formed in nozzle layer 330. Rows 181 and 182 extend along row direction 51 and are staggered with respect to each other in order to provide increased printing resolution. In the example shown in FIG. 14, the substrate 100 of the piezoelectric printing device includes a first edge 103 and a second edge 104 that extend along row direction 51. An ink inlet port 235 is disposed in at least one of first and second edges 103 and 104. For example, an ink inlet port 235 in first edge 103 can provide ink for row 181 and an ink inlet port 235 in second edge 104 can provide ink for row 182 of drop ejectors 150.

Ink is provided to piezoelectric printing device 8, 9, 10 or 11 by ink source 190 through at least one ink inlet port 235 and travels to the ink inlets 121 of pressure chambers 111 and 112 (FIGS. 4, 6 and 8). Ink source 190 is generically understood herein to include any substance that can be ejected from an inkjet printhead drop ejector. Ink source 190 can include colored ink such as cyan, magenta, yellow or black. Alternatively ink source 190 can include conductive material, dielectric material, magnetic material, or semiconductor material for functional printing. Ink source 190 can alternatively include biological, chemical, medical or other materials. Piezoelectric printing devices are well suited for ejecting a wide variety of ink types including solvent based inks, UV curing inks, and aqueous inks.

Figure 15:
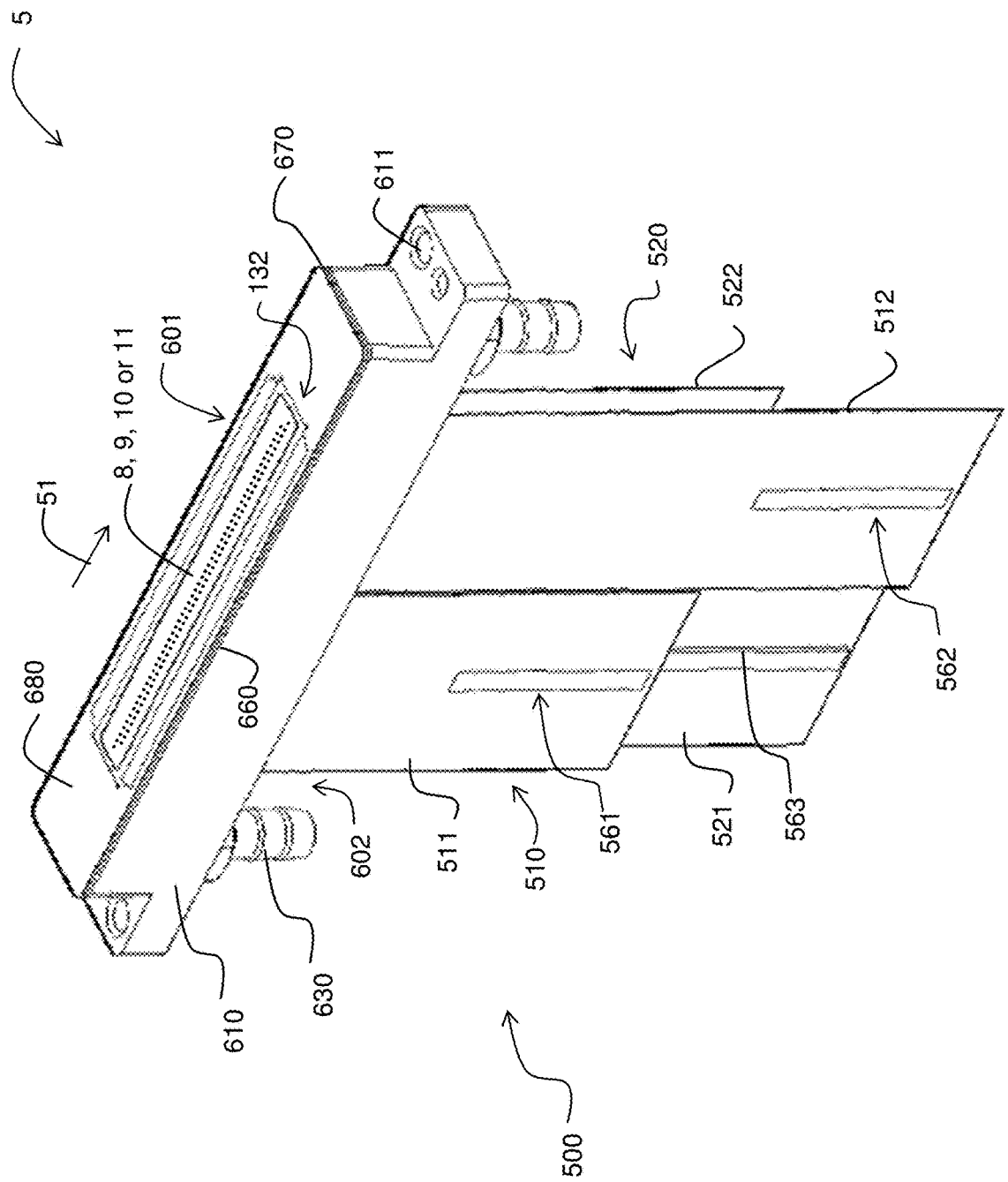
FIG. 15 shows a perspective of a piezoelectric printhead from an ink ejection side according to an embodiment.
Figure 18:
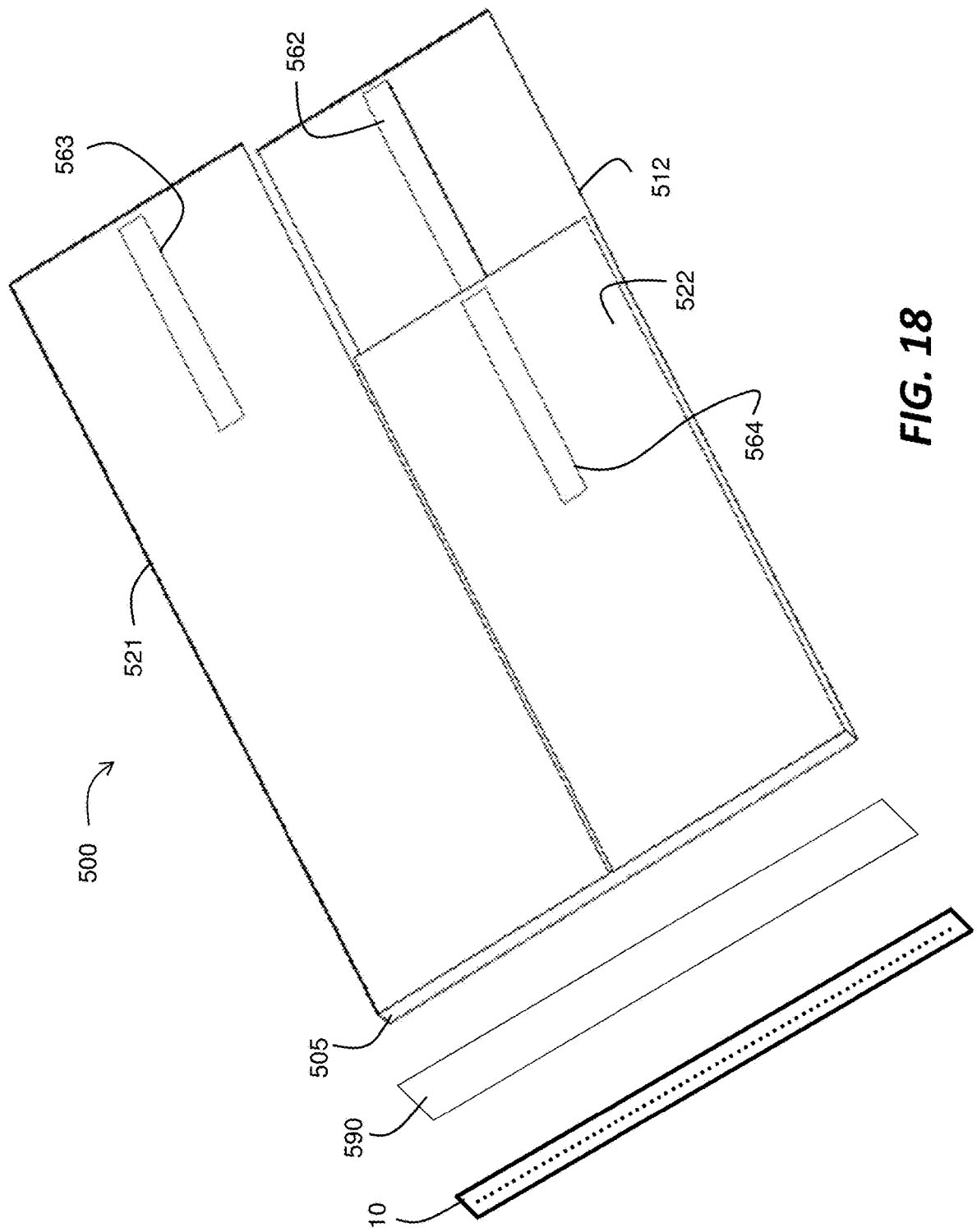
FIG. 18 shows an exploded perspective illustrating connection to a piezoelectric printing device.

FIG. 15 shows a perspective of piezoelectric printhead 5, which includes piezoelectric printing device 8, 9, 10 or 11 as well as printhead package components such as U-shaped flexible printed wiring element 500, connectors 561-564 (see also FIG. 18), manifold 610, ink tubing connectors 630 (also called ink connectors herein), first plate 660, second plate 670 and third plate 680. The printhead package components facilitate electrical connection and fluidic connection of the piezoelectric printing device 8, 9, 10 or 11 to the rest of inkjet printing system 1 (FIG. 14), as well as providing mechanical and environmental protection and mounting features. U-shaped flexible printed wiring element 500 makes high density electrical connection to the signal input pads 255, 455, or 755 (which can be at a spacing of 0.010" for example) through interconnection element 590 as described above with reference to FIGS. 4, 6, 8, 10 and 11. By routing a quarter of the signal connection lines 531 and the ground connection lines 541 to each of the four connector attachment regions 550 (FIG. 12), the connection density is reduced to facilitate mounting connectors 561-564 (FIGS. 15 and 18). By having one connector each on first portion 511 and second portion 512 of first leg 510 and one connector each on first portion 521 and second portion 522 of second leg 520, electrical connection can be made to corresponding individual board connectors 31-34 on logic board 30 (FIG. 14) as described below with reference to FIG. 25 without requiring excessive connection force. In the example shown in FIG. 15, connectors 561-564 are mounted on the inside of the U-shaped flexible printed wiring element 500, such that connector 561 on first portion 511 of first leg 510 is offset from and faces connector 563 on first portion 521 of second leg 520 (and similarly for connector 562 on second portion of first leg 510 and connector 564 on second portion of second leg 520).

Fluidic connection between ink source 190 (FIG. 14) and piezoelectric printing device 8, 9, 10 or 11 is provided by connecting ink tubing (not shown) to ink connectors 630, which bring ink to manifold 610. A fluid path to the ink inlet ports 235 (FIG. 14) on piezoelectric printing device 8, 9, 10 or 11 is defined by manifold 610 as well as by first plate 660, second plate 670 and third plate 680 as described in more detail below. First plate 660, second plate 670 and third plate 680 can be made of stainless steel, for example. Mechanical protection of piezoelectric printing device 8, 9, 10 or 11 is provided by manifold 610 and the outer third plate 680.

Third plate 680 helps to protect the nozzles 132 during wiping and also provides a capping surface during various printhead maintenance operations in inkjet printing system 1. Mounting holes 611 provide a way to attach the inkjet printhead 5 to a carriage in transport mechanism 16 (FIG. 14) for example.

Figure 16:
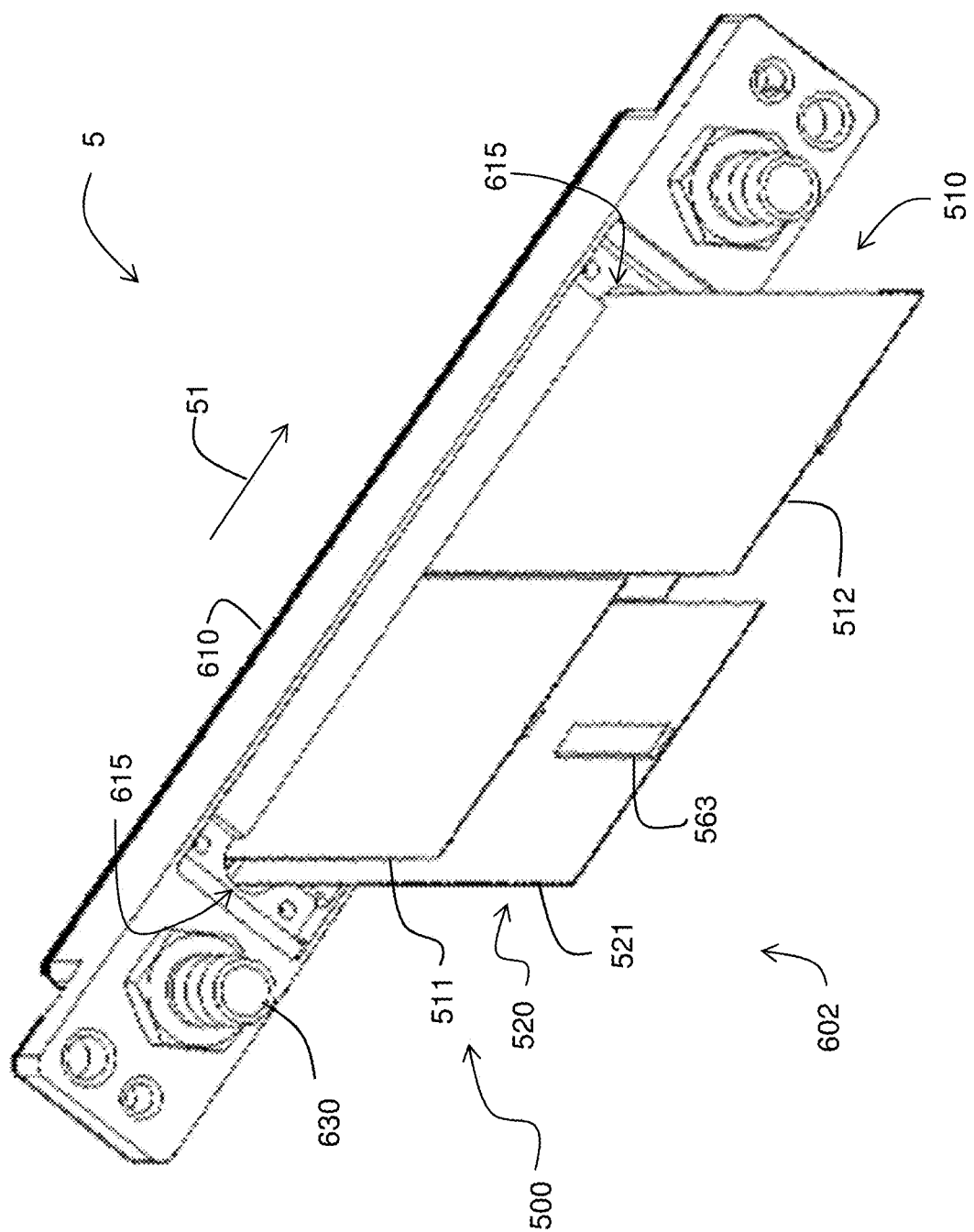
FIG. 16 shows a perspective of the piezoelectric printhead of FIG. 15 from a connection side.

The perspective of piezoelectric printhead 5 shown in FIG. 15 shows the ink ejection side 601 including nozzles 132. The perspective of piezoelectric printhead 5 in FIG. 16 shows the connection side 602, including a slot 615 in manifold 610 that extends along the row direction 51. First leg 510 and second leg 520 of U-shaped flexible printed wiring member 500 extend through slot 615 in order to connect to the contact layer of piezoelectric printing device 8, 9, 10 or 11 through interconnection element 590 as described above with reference to FIGS. 10 and 11. Ink connectors 630 are also connected to the connection side 602 of manifold 610.

Figure 17:
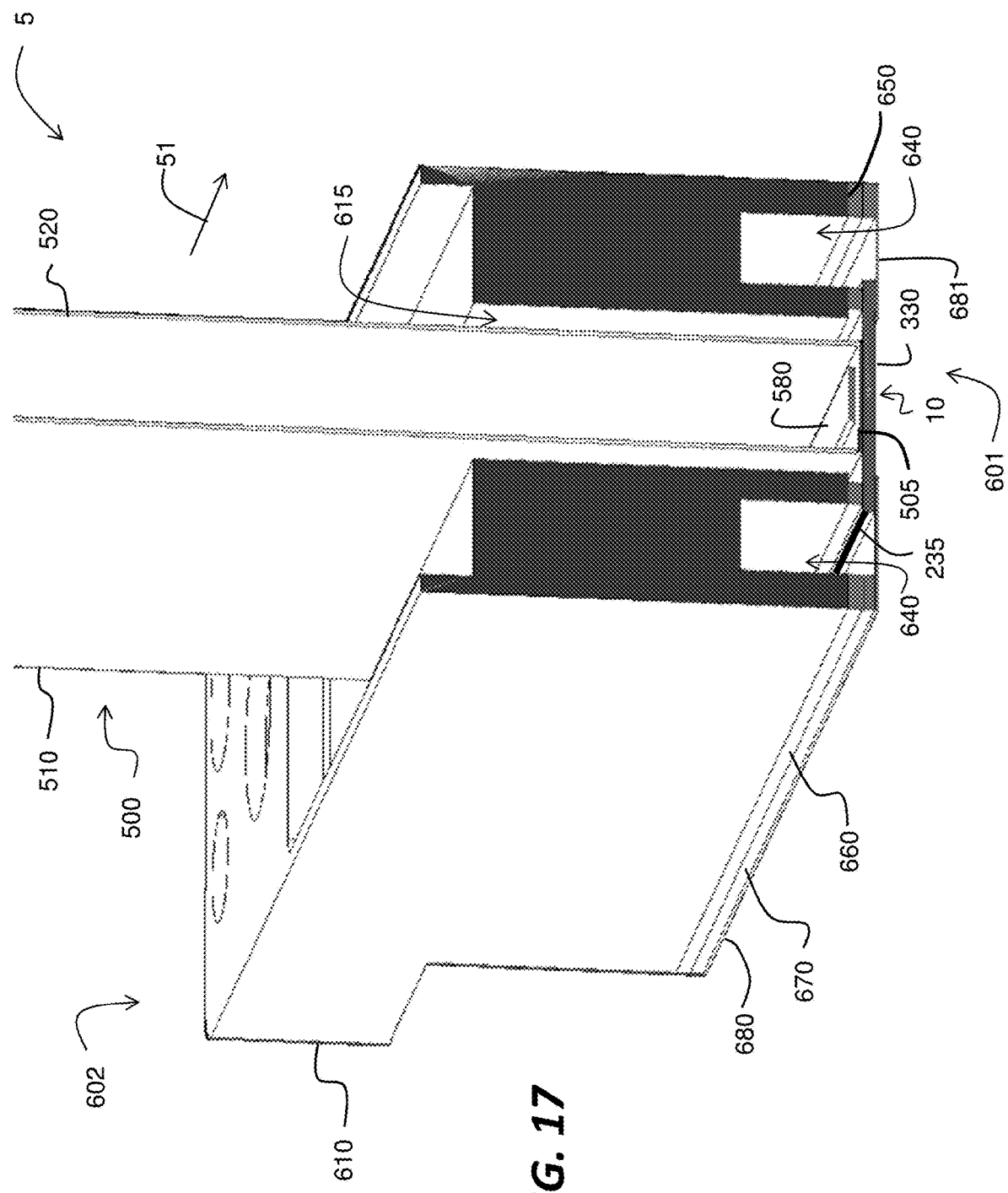
FIG. 17 shows a cross-sectional view of the piezoelectric printhead of FIG. 15.

FIG. 17 shows a cross-sectional view of piezoelectric printhead 5 through the middle along a plane that extends between first portion 511 and second portion 512 of first leg 510 of the U-shaped flexible printed wiring element 500 (see FIG. 15). As described above, first leg 510 and second leg 520 of U-shaped flexible printed wiring member 500 extend through slot 615 such that device connection region 505 makes electrical connection to the contact layer of piezoelectric printing device 10 through interconnection element 590 (FIG. 10). (In the example shown in FIG. 17, the contact layer that makes electrical connection with the device connection region 505 is disposed on the outer surface of the piezoelectric plate, so the piezoelectric printing device could alternatively be a piezoelectric printing device 9 in this example. Connection to a printhead 5 for a piezoelectric printing device 8 or 11 would be configured as in FIG. 11.) A bar-shaped element 580 is disposed along row direction 51 proximate to the device connection region 505 between the first leg 510 and the second leg 520 of the U-shaped flexible printed wiring element 500. Bar-shaped element 580 provides structural support and strain relief for the connection of U-shaped flexible printed wiring element 500 to piezoelectric printing device 10. It also helps keep legs 510 and 520 apart from each other. The cross-sectional view of FIG. 17 also shows a portion of a fluid path defined by conduit 640 of manifold 610, first plate 660, second plate 670 and third plate 680 to provide ink to ink inlet port 235. First plate 660 is bonded to fluid connection face 650 of manifold 610. Piezoelectric printing device 10 is bonded to first plate 660 such that first plate 660 is disposed between the fluid connection face 650 and the piezoelectric printing device 10. Second plate 670 has a first side 674 (FIG. 22) that is bonded to a side 663 (FIG. 20) of the first plate 660 that is opposite to a side of first plate 660 that is bonded to the fluid connection face 650 of the manifold 610. Third plate 680 is bonded to a second side 673 (FIG. 22) of the second plate 670 that is opposite to the first side 674 of the second plate 670. The second plate 670 has substantially the same thickness (i.e. within twenty microns of the same thickness) as piezoelectric printing device 10, so that the second side 673 of the second plate 670 is substantially flush with the outer surface of nozzle layer 330 (FIG. 14) on the ink ejection side 601 of the piezoelectric printhead 5. The outer surface of nozzle layer 330 is recessed slightly behind the outer surface 681 of the thin third plate 680 so that the nozzles are protected.

FIG. 18 shows an exploded perspective of piezoelectric printing device 10, interconnection element 590 and U-shaped flexible printed wiring element 500. Connector 564, which is mounted on the inner side of second portion 522 of second leg 520 is visible in this view.

Figure 19:
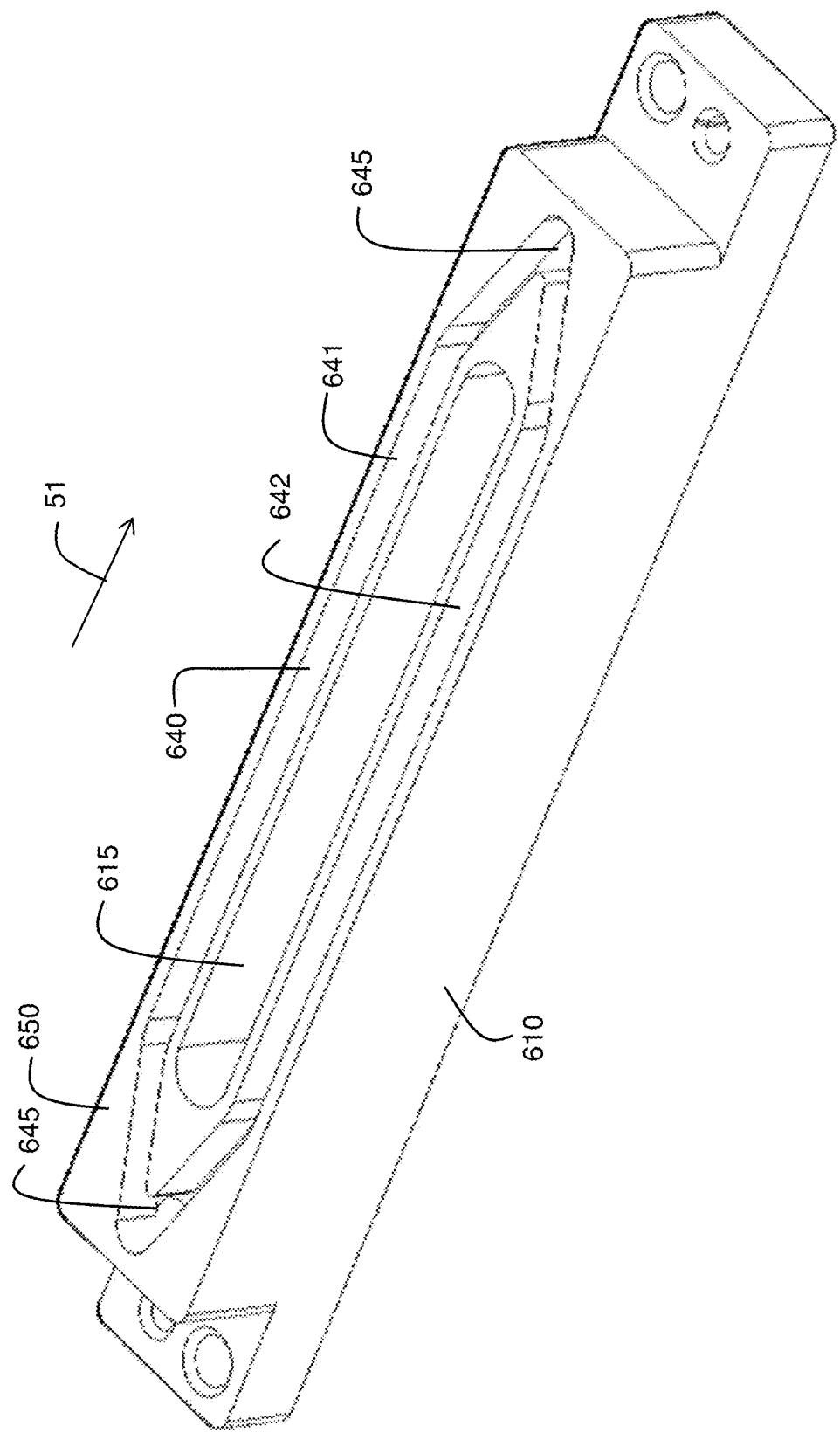
FIG. 19 shows a perspective of a manifold of the piezoelectric printhead of FIG. 15.

FIG. 19 shows a perspective of manifold 610 showing fluid connection face 650. Conduit 640 includes a pair of ends 645 into which ink is provided through ink connectors 630 (FIG. 15). First member 641 extends between the two ends 645 along the row direction 51 on one side of slot 615 for providing ink to ink inlet port 235 on first edge 103 (FIG. 14) for row 181 of drop ejectors. Second member 642 extends between the two ends 645 along the row direction 51 on an opposite side of slot 615 for providing ink to ink inlet port 235 on substrate edge 104 (FIG. 14) for row 182 of drop ejectors. In other words, conduit 640 is offset from the slot 615. By having two ink connectors 630 and a conduit 640 that is connected to both ink connectors, it is possible to use both ink connectors 630 as ink inputs. Alternatively it is possible to use one as an input and one as an output in order to circulate ink through manifold 610 for cleaning, for removing air bubbles or particulate, for ink mixing or refreshing, or for thermal control.

Figure 20:
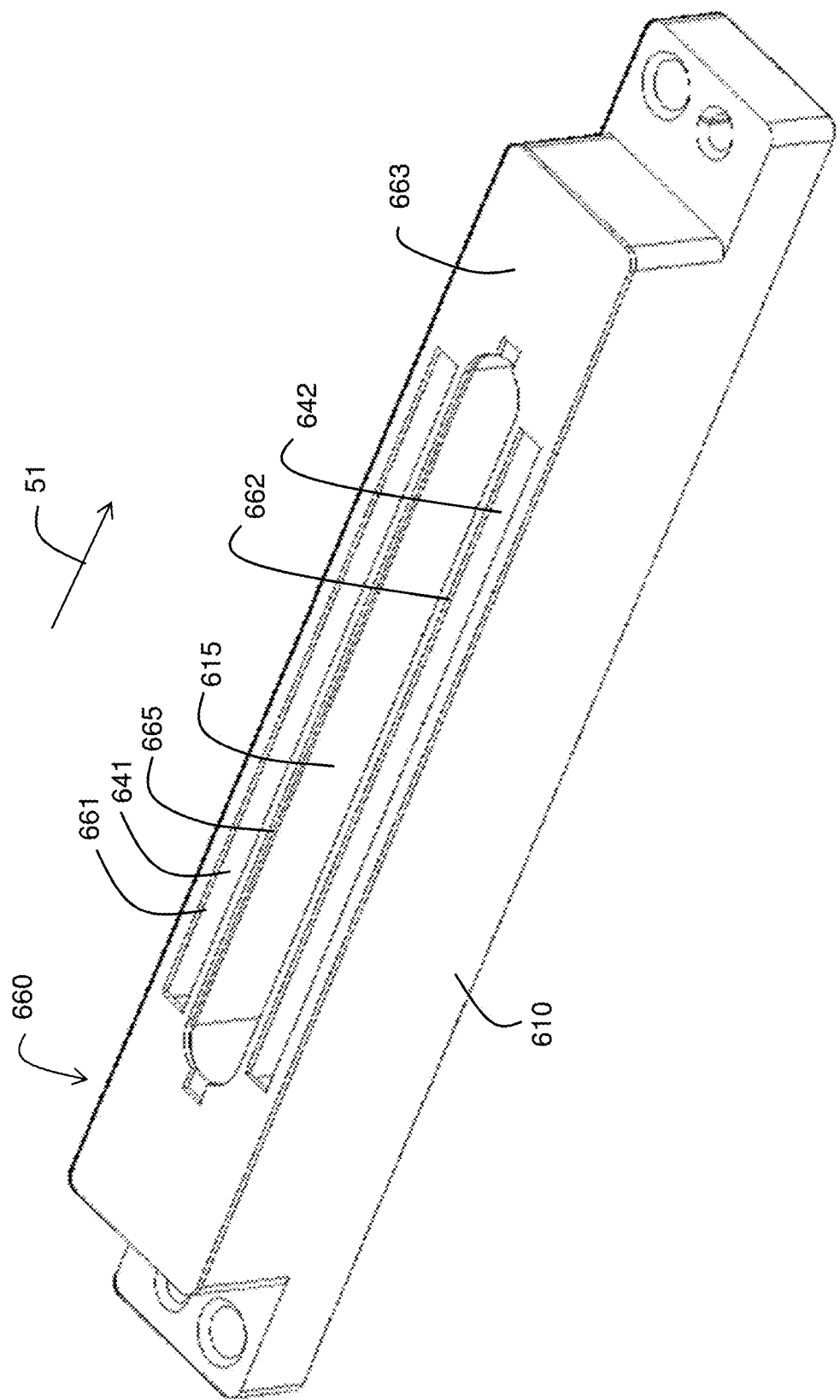
FIG. 20 shows the manifold of FIG. 19 with a first plate bonded to it.

FIG. 20 shows a perspective similar to that of FIG. 19 with first plate 660 attached to the fluid connection face 650 of manifold 610 (FIG. 19). First plate 660 includes a side that is bonded to the fluid connection face 650 of manifold 610, as well as a side 663 that is opposite to that side. End portions of first plate 660 cover the two ends 645 of conduit 640 (FIG. 19). Openings 661 and 662 in first plate 660 respectively expose first member 641 and second member 642 of conduit 640. Opening 665 in first plate 660 exposes slot 615 in manifold 610.

Figure 21:
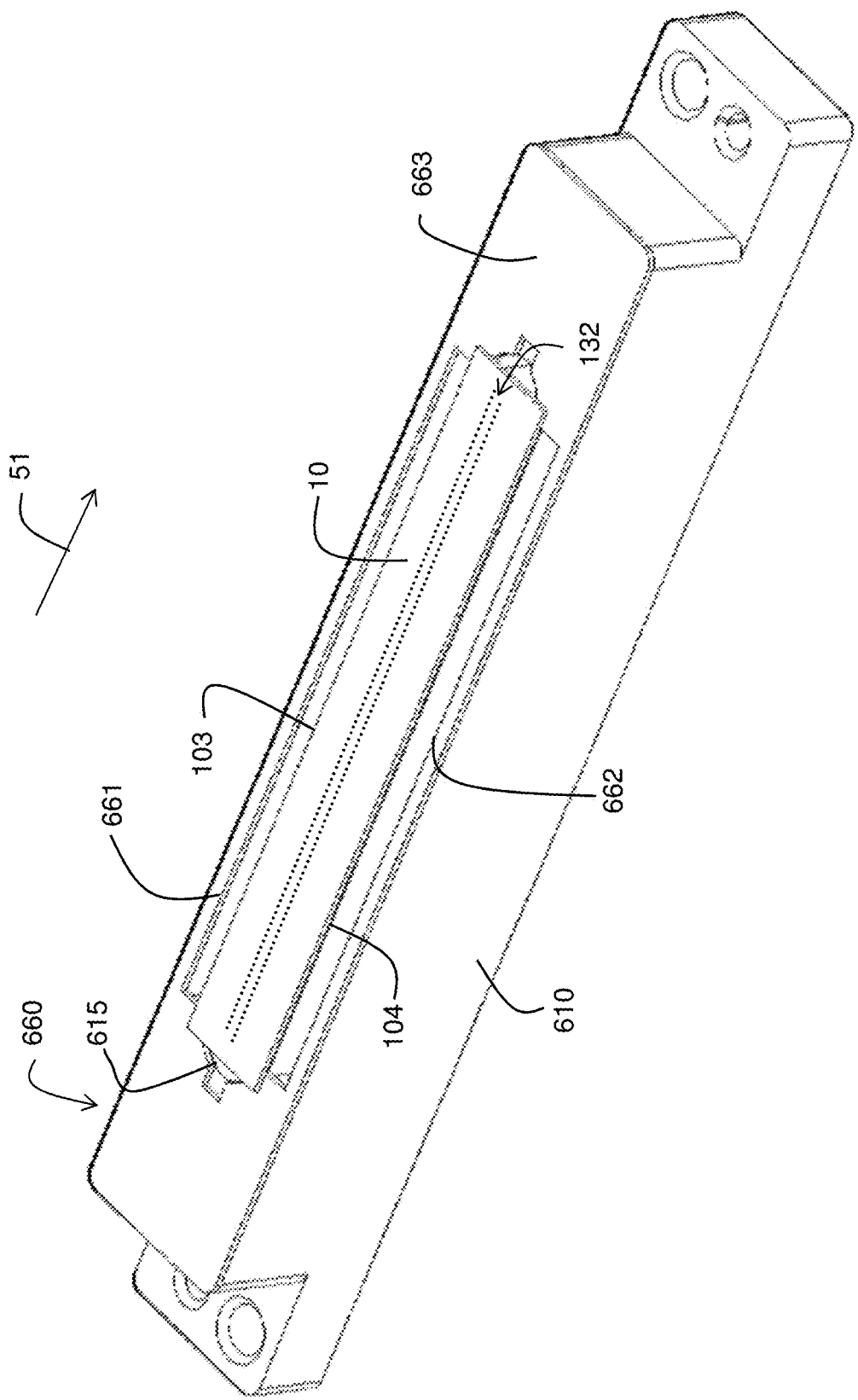
FIG. 21 shows the assembly of FIG. 20 with piezoelectric printing device bonded to the first plate.

FIG. 21 shows a perspective similar to that of FIG. 20 with piezoelectric device 10 bonded to side 663 of first plate 660. Piezoelectric printing device 10 extends across the slot 615 in manifold 610. Piezoelectric printing device 10 overhangs openings 661 and 662 of first plate 660 to allow ink to flow to ink inlet ports 235 in first and second edges 103 and 104 (FIG. 14).

Figure 22:
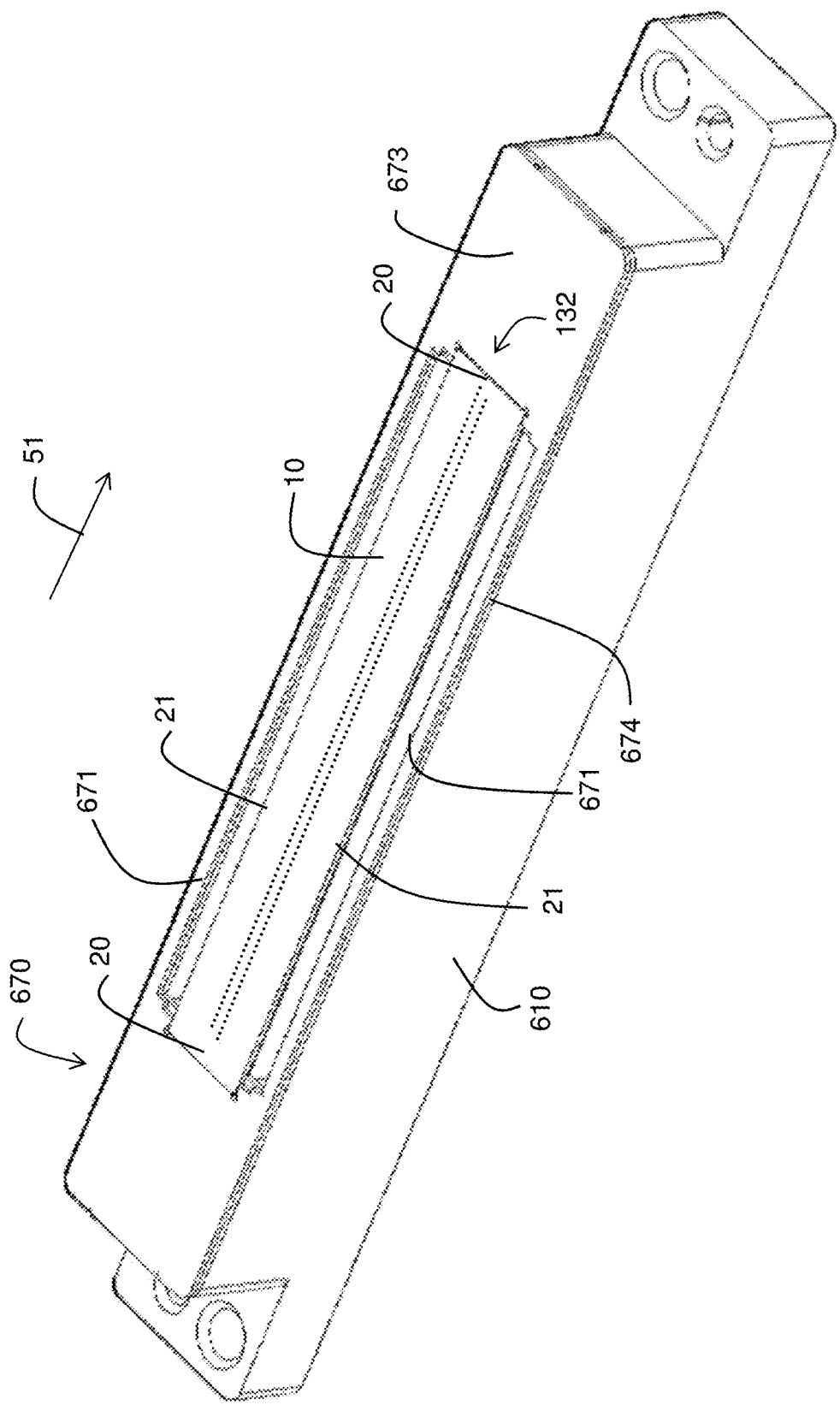
FIG. 22 shows the assembly of FIG. 21 with a second plate bonded to the first plate.

FIG. 22 shows a perspective similar to that of FIG. 21 with a first side 674 of second plate 670 bonded to side 663 (FIG. 21) of first plate 660. Opening 671 in second plate 670 extends over piezoelectric printing device 10 as well as over openings 661 and 662 FIG. 20) respectively in first plate 660. Nozzles 132 do not extend all the way to end portions 20 of piezoelectric printing device 10.

Figure 23:
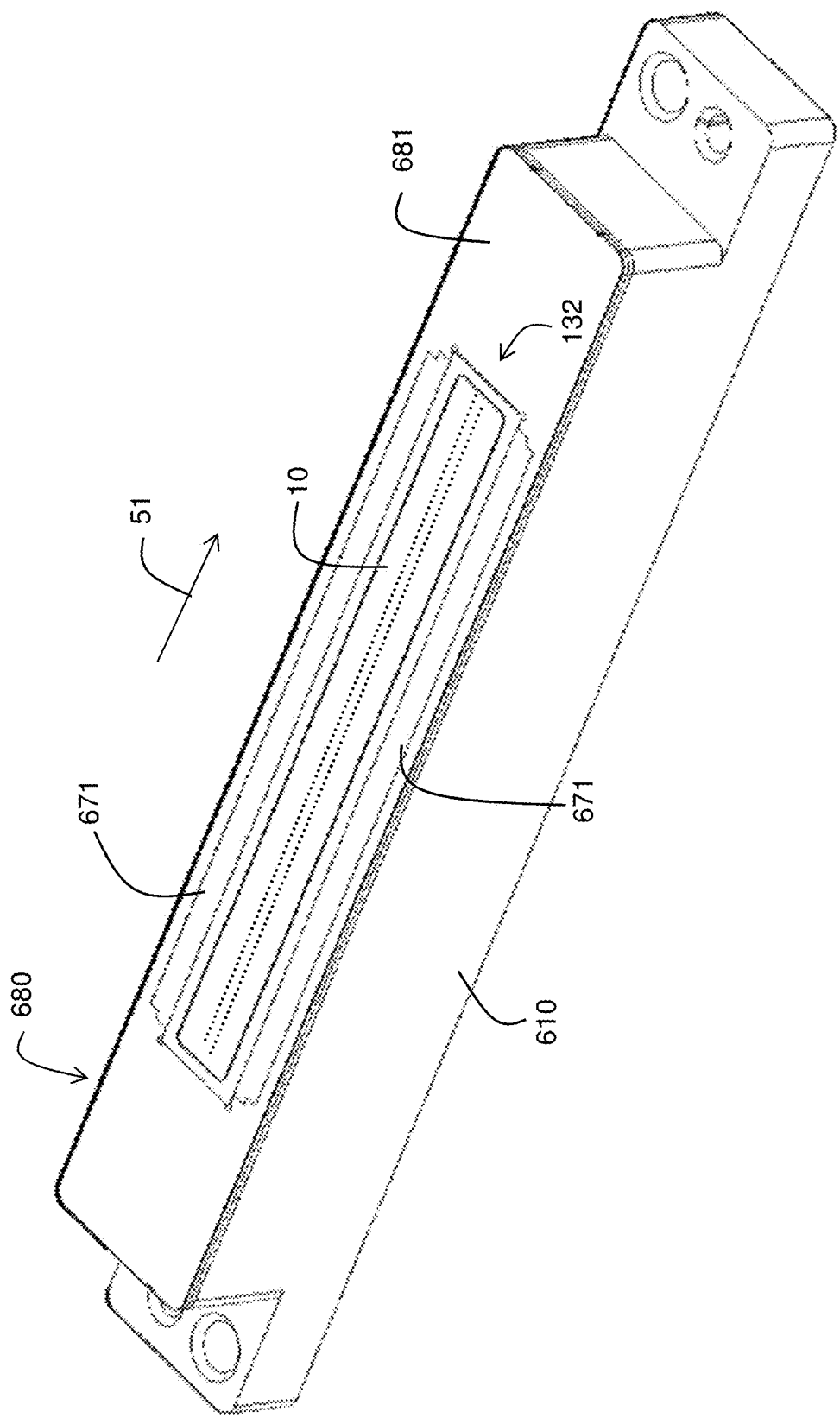
FIG. 23 shows the assembly of FIG. 22 with a third plate bonded to the second plate.

FIG. 23 shows a perspective similar to FIG. 22 with third plate 680 bonded to second side 673 of second plate 670. The third plate 680 has an opening 700 over the nozzle outer surface of the piezoelectric printing device 10 to expose the nozzle area. Third plate 680 covers over opening 671 in second plate 670 (FIG. 22) but is shown as transparent so opening 671 can be seen. Third plate 680 covers end portions 20 and side portions 21 (FIG. 22) of piezoelectric printing device 10. The purpose of third plate 680 is to seal the fluid pathway that extends from conduit 640 through first plate 660 and second plate 670. Third plate 680 also overlaps the edges of piezoelectric printing device 10 and protects the nozzles 132 from damage.

Figure 24:
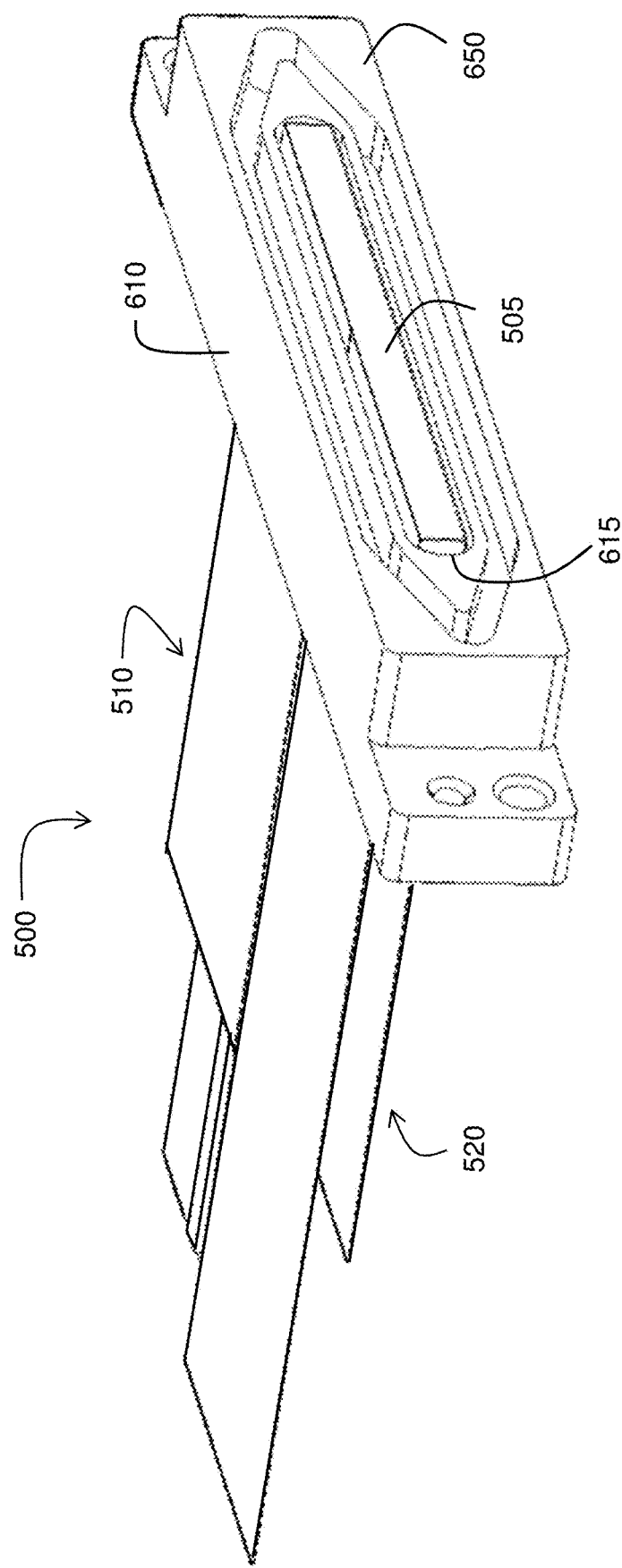
FIG. 24 shows a perspective of a U-shaped flexible printed wiring element extending into a slot in the manifold.

FIG. 24 shows a perspective of manifold 610 and U-shaped flexible printed wiring element 500 with the piezoelectric printing device 10, and the three plates 660, 670 and 680 hidden so that pair of legs 510 and 520 and device connection region 505 can be seen within slot 615 of manifold 610.

For simplicity, FIGS. 15-23 show a piezoelectric printhead 5 with connection to a piezoelectric printing device 9 or 10. A piezoelectric printhead 5 with connection to a piezoelectric printing device 8 or 11 is similar, where the device connection region 505 of the U-shaped flexible printed wiring element 500 extends through opening 218 in piezoelectric plate 210 as shown in FIG. 11. The external form factor of a piezoelectric printhead 5 for a piezoelectric printing device 9 or 10 is sufficiently similar to a piezoelectric printhead 5 for a piezoelectric printing device 8 or 11 that any of the four types can be mounted in the same inkjet printing system 1 (FIG. 14). Because piezoelectric printing devices 8, 9 or 11 can be more energy efficient than piezoelectric printing device 10, the operating parameters (such as electrical pulse waveforms from electrical pulse source 15 of FIG. 14) may need to be adjusted when replacing one type of printhead with another.

Figure 25:
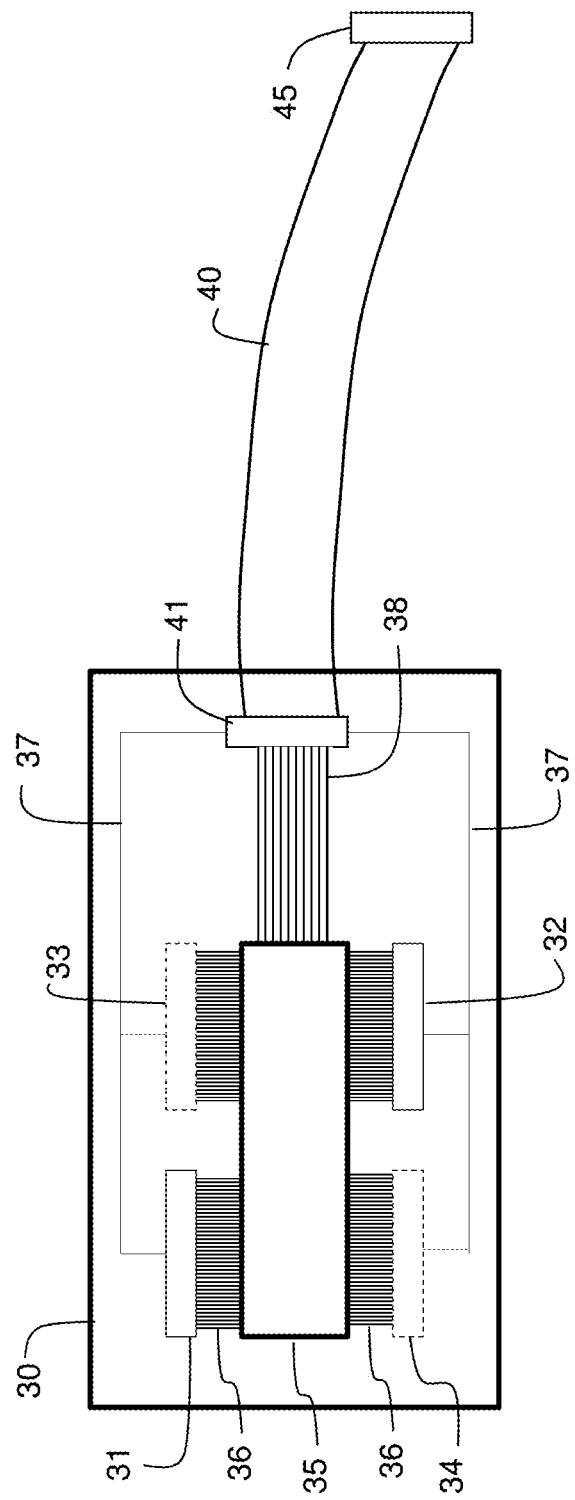
FIG. 25 schematically represents a logic board that can be used to connect the U-shaped flexible printed wiring element of FIG. 10 or 11 to other parts of the inkjet printing system.

FIG. 25 is a schematic representation of a logic board 30 that connects to the U-shaped flexible printed wiring element 500 of the piezoelectric printhead 5. Logic board 30 fits between first leg 510 and second leg 520 of the U-shaped flexible printed wiring element 500 (FIGS. 15 and 18) such that board connectors 31-34 connect to connectors 561-564 respectively. Board connectors 31 and 32 are mounted on the top side of logic board 30 (toward the viewer), and board connectors 33 and 34 are mounted on the bottom side of logic board 30. In the example shown in FIG. 25, a cable 40 having on the order of twenty leads (not shown) is connected to logic board 30 at cable connector 41. Printing apparatus connector 45 provides connection of cable 40 to other parts of the inkjet printing system 1 (FIG. 14) such as the controller 14 and the electrical pulse source 15. Cable 40 includes inputs for the logic device 35, such as logic voltage, ground, clock, data, electrical pulses, and other functions. These inputs are connected to logic device 35 by control leads 38. Ground leads 37 also provide ground to connectors 31-34. Logic device 35 provides firing pulses to connectors 31-34 through signal leads 36 for controllably actuating the drop ejectors 150 of piezoelectric printing device 8, 9, 10 or 11. As described above with reference to FIG. 13, piezoelectric printing device 8, 9, 10 or 11 can have three hundred and sixty signal inputs plus several ground inputs. Logic board 30 facilitates electrical connection while only requiring a cable having on the order of twenty leads to connect the piezoelectric printhead 5 to the other parts of the inkjet printing system 1. This is particularly important for an inkjet printing system 1, such as a carriage printer, so that the cable 40 is not unwieldy or overly stiff as the piezoelectric printhead 5 is moved back and forth. Logic board 30 is typically a rigid printed circuit board. Alternatively logic board 30 and cable 40 can be part of a single flexible printed wiring element. In such cases, cable connector 41 is not needed. Logic board 30 can also include passive devices such as capacitors and resistors (not shown) or additional active devices (not shown).

The invention has been described in detail with particular reference to certain preferred embodiments thereof, but it will be understood that variations and modifications can be effected within the spirit and scope of the invention.

The invention claimed is:
1. A piezoelectric printhead comprising:
a piezoelectric printing device including:
  a substrate;
  at least one row of drop ejectors disposed on the substrate, each row being aligned along a row direction, each drop ejector including:
    a pressure chamber; and
    a nozzle disposed in a nozzle layer that is in fluid connection with the pressure chamber;
  a piezoelectric plate including:
    a first surface that is disposed proximate to the pressure chambers opposite the nozzle layer; and
    an outer second surface opposite to the first surface;
  at least one ink inlet port that provides ink to the pressure chambers of the drop ejectors;
  a signal line corresponding to each drop ejector in the at least one row, each signal line leading to a corresponding signal input pad; and
  at least one common ground bus disposed along the row direction, the common ground bus being connected to ground traces that are disposed between adjacent pressure chambers, wherein the at least one common ground bus leads to at least one ground return pad;
a manifold that is fluidically connected to the at least one ink inlet port;
a U-shaped flexible printed wiring element including:
  a device connection region including:
    a plurality of signal connection pads, each signal connection pad facing a corresponding signal input pad; and
    at least one ground connection pad, each ground connection pad facing a corresponding ground return pad;
  a pair of legs extending from the device connection region, the pair of legs each including:
    a plurality of signal connection lines, each signal connection line extending from a corresponding signal connection pad; and
    at least one ground connection line, each ground connection line extending from a corresponding ground connection pad; and
an interconnection element disposed between the device connection region of the U-shaped flexible printing wiring element and a contact layer of the piezoelectric printing device that includes the signal input pads and the at least one ground return pad.

2. The piezoelectric printhead of claim 1, wherein the contact layer is disposed on the first side of the substrate.

3. The piezoelectric printhead of claim 2, wherein the device connection region of the U-shaped flexible printed wiring element extends through an opening in the piezoelectric plate to make connection to the signal input pads and the at least one ground return pad on the first side of the substrate.

4. The piezoelectric printhead of claim 1, wherein the contact layer is disposed on the outer second surface of the piezoelectric plate.

5. The piezoelectric printhead of claim 1 further comprising a bar-shaped element disposed along the row direction proximate to the device connection region between the pair of legs of the U-shaped flexible printed wiring element.

6. The piezoelectric printhead of claim 1, wherein the plurality of signal connection lines and the at least one ground connection line on each of the legs are electrically connected to at least one connector mounted on the U-shaped flexible printed wiring element.

7. The piezoelectric printhead of claim 6, wherein a first connector that is mounted to a first leg of the pair of legs is offset from and faces a second connector that is mounted to a second leg of the pair of legs.

8. The piezoelectric printhead of claim 1, wherein each of the pair of legs is bifurcated.

9. The piezoelectric printhead of claim 1, the manifold including a slot disposed along the row direction, wherein the piezoelectric printing device extends across the slot and wherein both legs of the U-shaped flexible printed wiring element extend through the slot.

10. The piezoelectric printhead of claim 9, the manifold including a fluid connection face having a conduit that is offset from the slot, the piezoelectric printhead further comprising:
a first plate disposed between the fluid connection face and the piezoelectric printing device;
a second plate having a first side that is bonded to a side of the first plate that is opposite to the fluid connection face of the manifold; and
a third plate that is bonded to a second side of the second plate that is opposite to the first side of the second plate.

11. The piezoelectric printhead of claim 10, wherein the first plate, the second plate and the third plate define a fluid path between the conduit in the fluid connection face and the at least one ink inlet port.

12. The piezoelectric printhead of claim 10, wherein the first plate, the second plate and the third plate each includes stainless steel.

13. The piezoelectric printhead of claim 10, wherein the second plate has substantially the same thickness as the piezoelectric printing device.

14. The piezoelectric printhead of claim 1, wherein the manifold is fluidically connected to at least two ink inlet ports in the piezoelectric printing device.

15. The piezoelectric printhead of claim 14, wherein the manifold is fluidically connected to at least two ink connectors.

16. The piezoelectric printhead of claim 1, wherein the interconnection element includes an anisotropic conductive film.

17. The piezoelectric printhead of claim 1, the substrate including a first edge and a second edge, each extending along the row direction, wherein the at least one ink inlet port is disposed in at least one of the first side edge and the second side edge.

18. A piezoelectric inkjet printing system comprising:
a piezoelectric printhead including:
a piezoelectric printing device including:
a substrate;
at least one row of drop ejectors disposed on the substrate, each row being aligned along a row direction, each drop ejector including:
a pressure chamber; and
a nozzle disposed in a nozzle layer that is in fluid connection with the pressure chamber;
a piezoelectric plate including:
a first surface that is disposed proximate to the pressure chambers opposite the nozzle layer; and
an outer second surface opposite to the first surface;
at least one ink inlet port that provides ink to the pressure chambers of the drop ejectors;
a signal line corresponding to each drop ejector in the at least one row, each signal line leading to a corresponding signal input pad; and
at least one common ground bus, the common ground bus being connected to ground traces that are disposed between adjacent pressure chambers, wherein the at least one common ground bus leads to at least one ground return pad;
a manifold that is fluidically connected to the at least one ink inlet port;
a U-shaped flexible printed wiring element including:
a device connection region including:
a plurality of signal connection pads, each signal connection pad facing a corresponding signal input pad; and
at least one ground connection pad, each ground connection pad facing a corresponding ground return pad;
a pair of legs extending from the device connection region, the pair of legs each including:
a plurality of signal connection lines, each signal connection line extending from a corresponding signal connection pad; and
at least one ground connection line, each ground connection line extending from a corresponding ground connection pad;
an interconnection element disposed between the device connection region and a contact layer that includes the signal input pads and the at least one ground return pad;
an image data source;
a controller;
an electrical pulse source; and
a logic board that is connected to the U-shaped flexible printed wiring element.

19. The piezoelectric inkjet printing system of claim 18, wherein the logic board is connected to the controller and the electrical pulse source.

\* \* \* \* \*